(12) United States Patent
Yang et al.

(10) Patent No.: US 9,165,878 B2
(45) Date of Patent: Oct. 20, 2015

(54) SEMICONDUCTOR PACKAGES AND METHODS OF PACKAGING SEMICONDUCTOR DEVICES

(71) Applicant: United Test and Assembly Center Ltd., Singapore (SG)

(72) Inventors: Yong Bo Yang, Singapore (SG); Chun Hong Wo, Singapore (SG)

(73) Assignee: UNITED TEST AND ASSEMBLY CENTER LTD., Singapore (SG)

( * ) Notice: Subject to any disclaimer, the term of this patent is extended or adjusted under 35 U.S.C. 154(b) by 0 days.

(21) Appl. No.: 14/094,763

(22) Filed: Dec. 2, 2013

(65) Prior Publication Data
US 2014/0264792 A1   Sep. 18, 2014

Related U.S. Application Data

(63) Continuation-in-part of application No. 13/802,769, filed on Mar. 14, 2013.

(51) Int. Cl.
*H01L 23/498* (2006.01)
*H01L 21/48* (2006.01)
(Continued)

(52) U.S. Cl.
CPC ...... *H01L 23/49838* (2013.01); *H01L 21/4846* (2013.01); *H01L 21/4853* (2013.01); *H01L 23/49816* (2013.01); *H01L 23/49827* (2013.01); *H01L 23/5385* (2013.01); *H01L 23/147* (2013.01); *H01L 23/3128* (2013.01); *H01L 2224/10175* (2013.01); *H01L 2224/16225* (2013.01); *H01L 2224/16237* (2013.01); *H01L 2224/32225* (2013.01);
(Continued)

(58) Field of Classification Search
CPC ........... H01L 2224/48091; H01L 2224/73265; H01L 2224/16225; H01L 2224/32225; H01L 2224/48228; H01L 2224/73204; H01L 2924/00014; H01L 2924/0002; H01L 2924/00; H01L 2924/15311; H01L 21/4821; H01L 21/4846; H01L 21/50; H01L 21/76885; H01L 23/147; H01L 23/3107; H01L 23/495; H01L 23/49541; H01L 23/49816; H01L 23/49827; H01L 2224/48227; H01L 2224/10175; H01L 2224/16237; H01L 2924/19105; H01L 21/4853; H01L 23/3128; H01L 23/49838; H01L 23/5385
See application file for complete search history.

(56) References Cited

U.S. PATENT DOCUMENTS

| | | |
|---|---|---|
| 5,072,520 A | 12/1991 | Nelson |
| 6,664,615 B1 | 12/2003 | Bayan et al. |

(Continued)

FOREIGN PATENT DOCUMENTS

WO   2011026261   3/2011

*Primary Examiner* — Brett Feeney
*Assistant Examiner* — Sophia Nguyen
(74) *Attorney, Agent, or Firm* — Horizon IP Pte. Ltd.

(57) ABSTRACT

Semiconductor packages and methods for forming a semiconductor package are presented. The method includes providing a package substrate having first and second major surfaces. The package substrate includes at least one substrate layer having at least one cavity. Interconnect structure is formed. At least one conductive stud is formed within the cavity and a conductive trace and a connection pad are formed over the first major surface of the package substrate and are coupled to top surface of the conductive stud. A package pad is formed and is directly coupled to the conductive stud. A die having conductive contacts on its first or second surface is provided. The conductive contacts of the die are electrically coupled to the interconnect structure. A cap is formed over the package substrate to encapsulate the die.

25 Claims, 27 Drawing Sheets

1400

(51) Int. Cl.
*H01L 23/538* (2006.01)
*H01L 23/14* (2006.01)
*H01L 23/31* (2006.01)

(52) U.S. Cl.
CPC ............... *H01L 2224/48091* (2013.01); *H01L 2224/48227* (2013.01); *H01L 2224/48228* (2013.01); *H01L 2224/73265* (2013.01); *H01L 2924/15311* (2013.01); *H01L 2924/19105* (2013.01)

(56) References Cited

U.S. PATENT DOCUMENTS

| | | | |
|---|---|---|---|
| 6,872,661 B1 | 3/2005 | Kwan et al. | |
| 7,064,012 B1 | 6/2006 | Lin | |
| 7,413,995 B2 * | 8/2008 | Sterrett et al. | 438/734 |
| 7,638,879 B2 | 12/2009 | Jiang et al. | |
| 7,709,935 B2 | 5/2010 | Islam et al. | |
| 7,749,809 B2 | 7/2010 | How et al. | |
| 7,863,757 B2 | 1/2011 | How et al. | |
| 8,046,912 B2 | 11/2011 | Kubota et al. | |
| 8,138,423 B2 | 3/2012 | Watanabe et al. | |
| 8,176,628 B1 * | 5/2012 | Rusli et al. | 29/852 |
| 8,735,224 B2 * | 5/2014 | Do et al. | 438/123 |
| 2003/0151067 A1 | 8/2003 | Iijima et al. | |
| 2003/0155638 A1 * | 8/2003 | Ito | 257/678 |
| 2007/0079986 A1 * | 4/2007 | Kikuchi et al. | 174/260 |
| 2007/0080439 A1 * | 4/2007 | Kikuchi et al. | 257/678 |
| 2007/0164457 A1 * | 7/2007 | Yamaguchi et al. | 257/787 |
| 2007/0246821 A1 | 10/2007 | Lu et al. | |
| 2008/0277783 A1 * | 11/2008 | Kim et al. | 257/737 |
| 2009/0223046 A1 * | 9/2009 | Murayama et al. | 29/847 |
| 2010/0213603 A1 * | 8/2010 | Smeys et al. | 257/698 |
| 2011/0001224 A1 | 1/2011 | San Antonio et al. | |
| 2011/0155433 A1 | 6/2011 | Funaya et al. | |
| 2011/0186992 A1 * | 8/2011 | Wu et al. | 257/737 |
| 2011/0198752 A1 | 8/2011 | Nondhasitthichai et al. | |
| 2011/0278741 A1 | 11/2011 | Chua et al. | |
| 2012/0091569 A1 | 4/2012 | Appelt et al. | |
| 2012/0267751 A1 | 10/2012 | Haba et al. | |
| 2012/0280390 A1 * | 11/2012 | Do et al. | 257/738 |
| 2012/0286419 A1 | 11/2012 | Kwon et al. | |
| 2013/0026657 A1 | 1/2013 | Hsiao et al. | |
| 2013/0099372 A1 * | 4/2013 | Kuechenmeister et al. | 257/737 |
| 2013/0168857 A1 | 7/2013 | Gregorich et al. | |

* cited by examiner

800

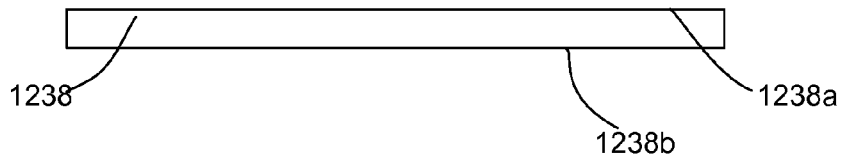
Fig. 12a
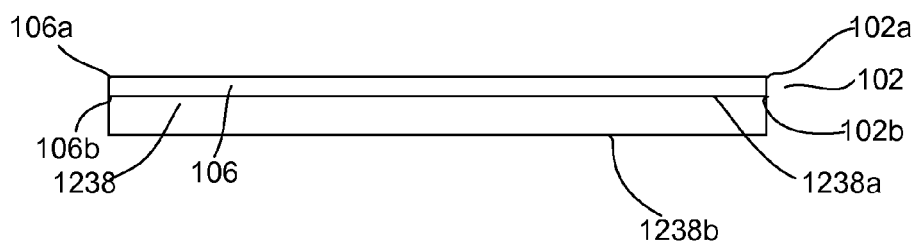
Fig. 12b
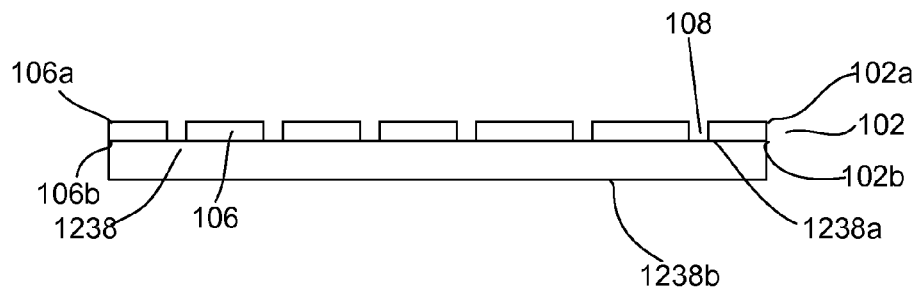
Fig. 12c$_1$
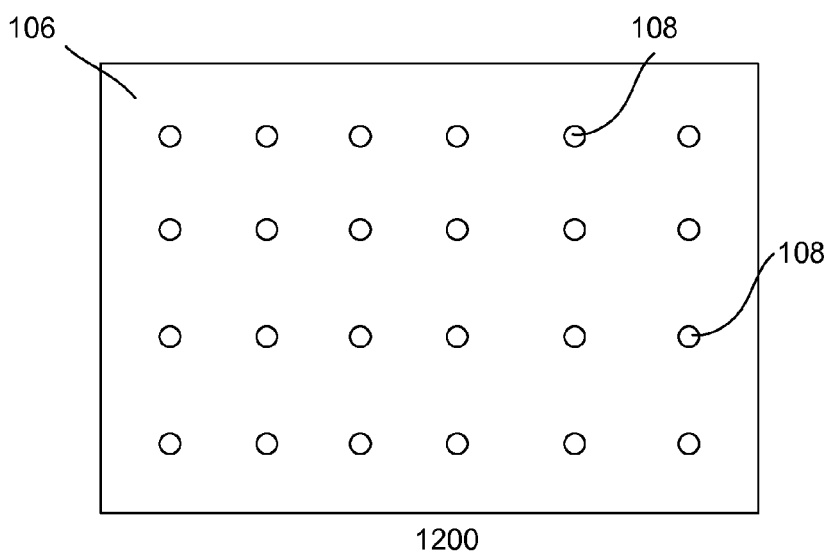
Fig. 12c$_2$

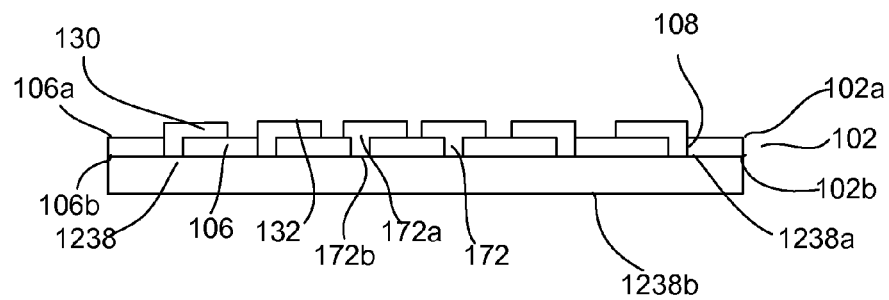
Fig. 12d
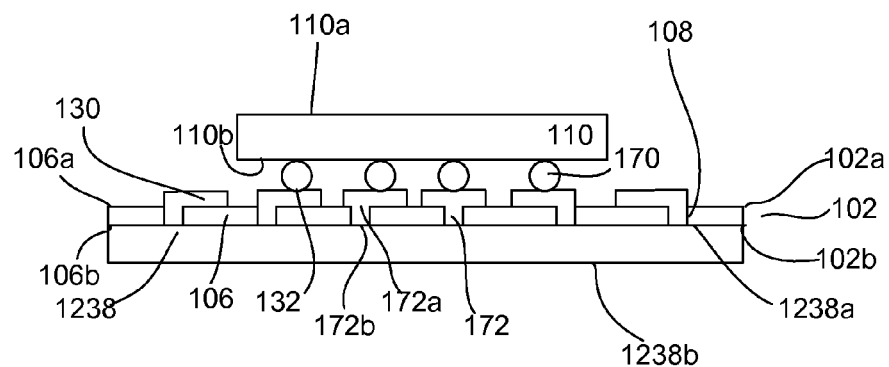
Fig. 12e₁
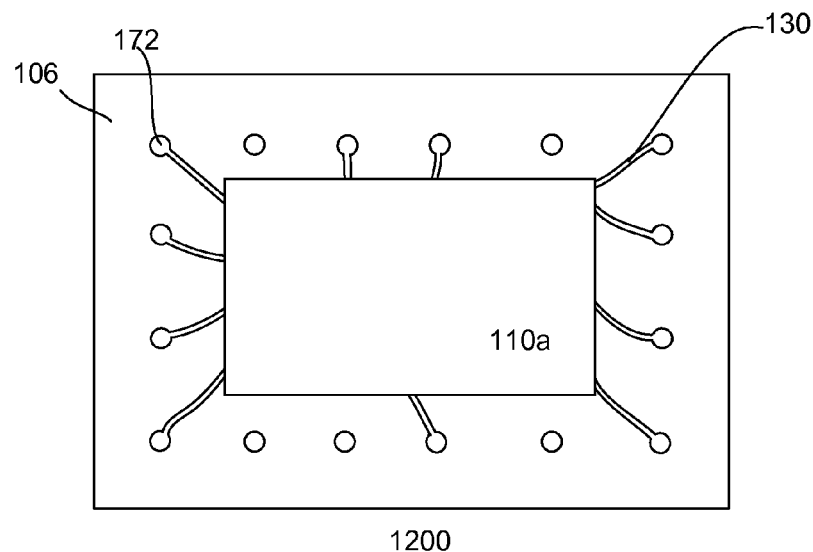
Fig. 12e₂

1400

SEMICONDUCTOR PACKAGES AND METHODS OF PACKAGING SEMICONDUCTOR DEVICES

CROSS-REFERENCE TO RELATED APPLICATION

This is a continuation-in-part application of co-pending U.S. patent application Ser. No. 13/802,769, filed on Mar. 14, 2013 entitled "Semiconductor Packages and Methods of Packaging Semiconductor Devices", which is herein incorporated by reference in its entirety.

BACKGROUND

Wafer level chip scale packages (WLCSP), thermal leadless array (TLA) packages and leadframe-based packages, such as high density leadframe array (HLA) packages, are popular packaging solutions for high I/O devices in the industry. However, existing WLCSP, TLA and leadframe-based packages suffer from several disadvantages. For example, the size of WLCSP is limited due to board level reliability, particularly for the larger size dies which face warpage issue. The die warpage weakens the connection structure between the bumps and printed circuit board (PCB) pads. Fine pitch bumping is also desired for these packages. However, current PCB module technology is not prepared to accommodate smaller pitch size. Therefore, the size of the die may not be reduced too much for warpage control. On the other hand, there is a need to increase the robustness of the TLA and HLA packages.

From the foregoing discussion, there is a desire to provide an improved package having higher I/O counts, fine pitch and flexible fan-out routings and with enhanced package level and PCB level reliability. It is desirable to provide simplified methods to produce a reliable package with better processability and which are able to bridge the conflict between the shrinking bump pitch and PCB large pitch issues. It is also desirable to have methods for forming semiconductor packages which are relatively low cost and which offer the flexibility for customization according to design requirements.

SUMMARY

Embodiments relate generally to semiconductor packages. In one embodiment, a method for forming a semiconductor package is presented. The method includes providing a package substrate having first and second major surfaces. The package substrate includes at least one substrate layer having at least one cavity. Interconnect structure is formed. At least one conductive stud is formed within the cavity and a conductive trace and a connection pad are formed over the first major surface of the package substrate and are coupled to top surface of the conductive stud. A package pad is formed and is directly coupled to the conductive stud. A die having conductive contacts on its first or second surface is provided. The conductive contacts of the die are electrically coupled to the interconnect structure. A cap is formed over the package substrate to encapsulate the die.

In another embodiment, a semiconductor package is disclosed. The semiconductor package includes a package substrate having first and second major surfaces. The package substrate includes at least one substrate layer having at least one cavity. The package includes interconnect structure. The interconnect structure includes at least one conductive stud disposed within the cavity, a conductive trace and a connection pad disposed over the first major surface of the package substrate and are coupled to top surface of the conductive stud. The interconnect structure also includes a package pad which is directly coupled to the conductive stud. The package includes a die having conductive contacts on its first or second surface. The conductive contacts of the die are electrically coupled to the interconnect structure. A cap is disposed over the package substrate to encapsulate the die.

These embodiments, along with other advantages and features herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 12*a*-12*h* show an embodiment of a method for forming a semiconductor package with FIG. 12*c*$_1$ shows cross-sectional view while FIG. 12*c*$_2$ shows top view of the substrate layer, and FIG. 12*e*$_1$ shows cross-sectional view while FIG. 12*e*$_2$ shows top view of the flip chip being mounted on the package substrate;

FIGS. 13*a*-13*c*, FIGS. 14*a*-14*l*, FIGS. 15*a*-15*l*, FIGS. 16*a*-16*d* and FIGS. 17*a*-17*n* show various other embodiments of a method for forming a semiconductor package.

DESCRIPTION

Embodiments relate to semiconductor packages and methods for forming a semiconductor package. The packages are used to package one or more semiconductor dies or chips. For the case of more than one die, the dies may be arranged in a planar arrangement, vertical arrangement, or a combination thereof. The dies, for example, may include memory devices, logic devices such as mixed signal logic devices, communication devices, RF devices, optoelectronic devices, digital signal processors (DSPs), microcontrollers, system-on-chips (SOCs) as well as other types of devices or a combination thereof. Such packages may be incorporated into electronic products or equipment, such as phones, computers as well as mobile and mobile smart products. Incorporating the packages into other types of products may also be useful.

Figure 1:
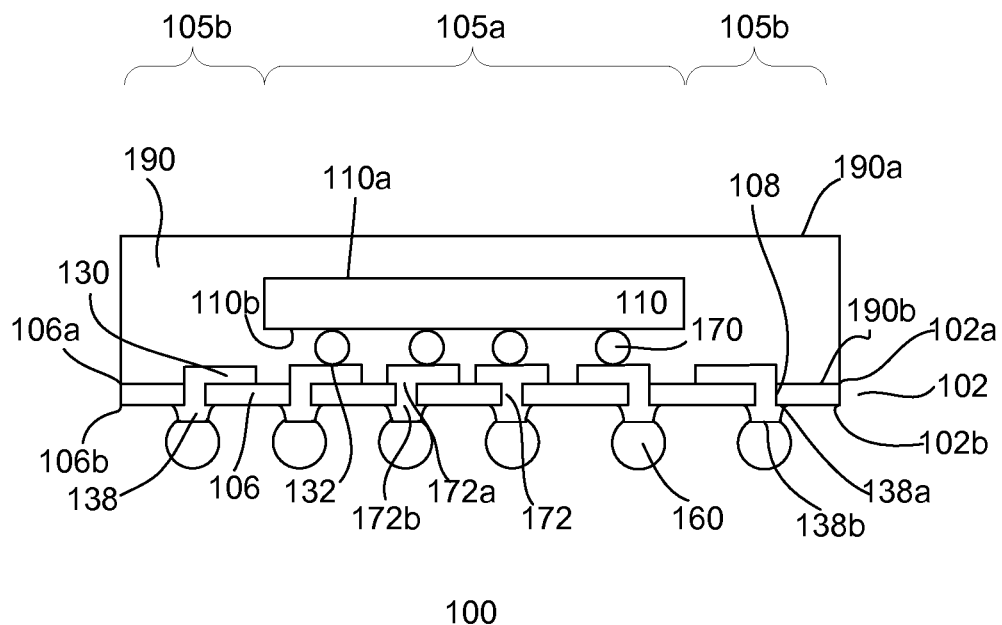
FIGS. 1-5 show various embodiments of a semiconductor package.

FIG. 1 shows simplified cross-sectional view of an embodiment of a semiconductor package 100. The semiconductor package, as shown in FIG. 1, includes a package substrate 102. The package substrate includes first and second major surfaces. The first major surface 102*a*, for example, may be referred to as the top surface and the second major surface 102*b*, for example, may be referred to as the bottom surface. Other designations for the surfaces may also be useful. In one embodiment, the first major surface of the package substrate includes first and second regions. The first region 105a, for example, is a die or chip region on which a die is mounted and the second region 105b, for example, is a non-die region. In one embodiment, the non-die region surrounds the die region. The die region, for example, may be disposed in a central portion of which the die is mounted and a non-die region which is outside of the die region. The die region, for example, may be concentrically disposed within the periphery of the package substrate. Other configurations of die and non-die regions may also be useful.

The package substrate 102, for example, is a built-up or integrated wiring substrate. In one embodiment, the package substrate includes a single layered substrate. In another embodiment, the package substrate includes multi-layered substrate. In one embodiment, the package substrate includes at least one substrate layer. Referring to FIG. 1, the package substrate includes a substrate layer 106. In one embodiment, the substrate layer includes a dielectric material. The dielectric material, for example, may include photo-imageable material, such as but not limited to solder mask, or insulating film, such as but not limited to polyimide, epoxy mold compound or other inorganic material. The substrate layer may be formed of other suitable types of substrate materials. The package substrate, for example, may be sufficiently thin or may include any suitable thickness, depending on manufacturing capabilities. The substrate layer includes first and second major surfaces 106a-106b, defining the first and second major surfaces 102a-102b of the package substrate. The substrate layer, in one embodiment, is a patterned or predefined substrate having a plurality of cavities 108 accommodating portions of interconnect structures of the package substrate, such as conductive studs, as will be described later.

The package substrate 102 includes a plurality of interconnect structures. As described, part of the interconnect structures, such as conductive studs 172, are disposed within the cavities 108 of the substrate layer 106. The conductive studs, in one embodiment, include a single conductive material. For example, the conductive studs may be formed of copper, aluminum, gold or an alloy thereof. Other suitable types of conductive materials may also be useful. The conductive studs, in another embodiment, may be formed of two or more conductive materials, forming a multi-layered stack. The multi-layered stack, for example, may include copper, nickel, gold, silver, alloys, or a combination thereof. Other suitable types of conductive materials may also be useful. The conductive studs may have various profiles depending on the shape of the cavities of the substrate layer. As shown in FIG. 1, the conductive studs include straight profiles. It is understood that the conductive studs may also include non-straight, tapered or other types of profiles.

The conductive studs include first and second surfaces. The second surface 172b of the conductive studs, in one embodiment, is substantially coplanar with the second surface of the package substrate. As for the first surface 172a of the conductive studs, it may be substantially coplanar or non-coplanar with the first surface of the package substrate. For example, the first surface of the conductive studs may be above or below the first surface of the package substrate. The width or diameter of the conductive studs, for example, is about 40 μm. The conductive studs may include any suitable dimension which is smaller than a width of package pads as will be described later.

In one embodiment, conductive traces 130 and connection pads 132 are disposed over the first surfaces of the package substrate and the conductive studs 102a and 172a. The conductive traces and connection pads are coupled to the first surface 172a of the conductive studs forming interconnects of the package substrate. The conductive traces and connection pads, in one embodiment, are formed of the same conductive material as the conductive studs, such as copper. In another embodiment, the conductive traces and connection pads may be formed of a different material than the conductive studs. Other suitable types of conductive material may also be useful. The portion of the conductive trace which is directly coupled to the top surface of the conductive stud, for example, includes suitable dimension which is slightly larger than the diameter of the conductive stud. This prevents disconnection between the conductive trace and the conductive stud which may be caused by misalignment during processing.

In one embodiment, package pads 138 having first and second surfaces 138a-138b for accommodating package contacts 160, of which package contacts are attached thereto, are disposed over the second surfaces of the package substrate and the conductive studs 102b and 172b. As shown in FIG. 1, the package pad 138, in one embodiment, is disposed over the second surface 102b and protruded outside of the package substrate. The package pads are directly coupled to the second surface of the conductive studs, forming part of the interconnect of the package substrate. The package pad, in one embodiment, is formed of the same conductive material as the conductive studs, such as copper. In another embodiment, the package pads may be formed of a different material than the conductive studs. The package pad, for example, has a larger dimension relative to the conductive stud for alignment requirement. The conductive stud, for example, may be designed to be offset from the center of the package pad so as to allow more conductive traces to pass through the space between any of the two adjacent conductive studs. Other suitable types of conductive material and other suitable dimensions may also be used for the package pads. The package pads, for example, include straight or tapered profiles. The package pads may also include other suitable shape profiles.

In one embodiment, a die 110 is disposed over the package substrate. The die can be a semiconductor die or chip. In one embodiment, the die includes a flip chip. The flip chip, as shown, is mounted on the die region of the package substrate. The flip chip, for example, includes inactive and active surfaces 110a-110b. Die contacts 170 are disposed on the active surface 110b of the die. The die contacts 170, for example, include solder bumps. The die contacts may also include other suitable types of conductive material. The connection pads 132, in one embodiment, are disposed in the die region of the package substrate. The connection pads 132, as shown, are configured to match the pattern of the die contacts of the flip chip. The connection pads, for example, include any suitable width or dimension, depending on the dimension of the die contacts. The conductive traces and connection pads thus couple the die contacts of the flip chip to the conductive studs and to the package pads of the package substrate. The conductive traces 130, connection pads 132, conductive studs 172 and package pads 138 form interconnect structures of the package substrate. An underfill (not shown), such as an epoxy-based polymeric material, may be provided in the space between the die and package substrate. Alternatively, no underfill is provided between the die and package substrate.

In one embodiment, a cap 190 having first and second surfaces 190a-190b is disposed on top of the package substrate, encapsulating the flip chip. The cap serves to protect the flip chip from the environment. The cap, for example, is formed of an encapsulation material. The encapsulation material, for example, may include molding epoxy resin material. Other types of encapsulation materials may also be useful.

Figure 2:
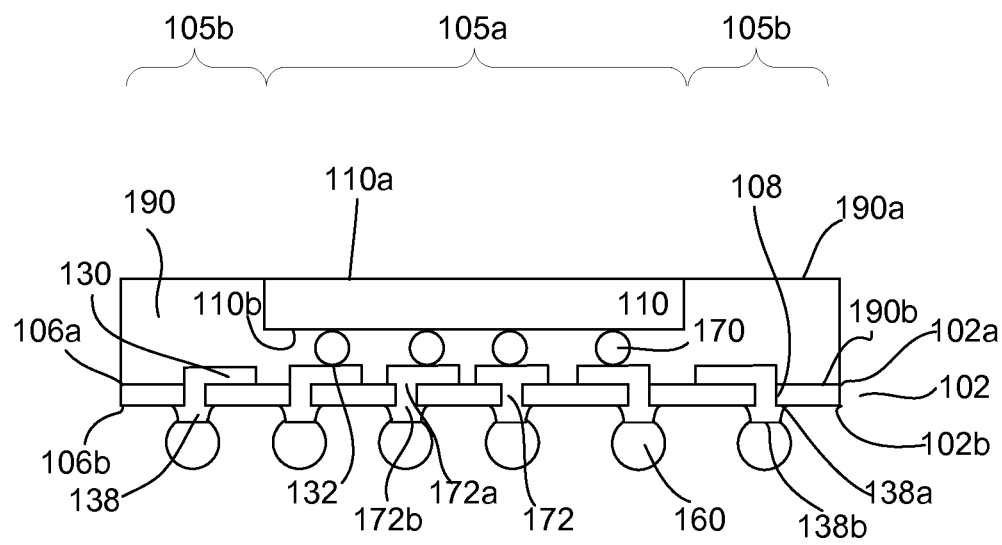

In one embodiment, the cap covers and surrounds the flip chip and the die contacts. The second surface of the cap 190b, in one embodiment, contacts the first surfaces of the package substrate and the conductive traces as shown in FIG. 1. In another embodiment, the cap 190 surrounds the sides of the flip chip, leaving the inactive surface 110a of the flip chip exposed as shown in FIG. 2. As such, the first surface of the cap 190a, as shown in FIG. 2, is substantially coplanar with the inactive surface of the flip chip 110a. By providing a cap which does not cover the inactive surface of the die helps improves the heat dissipation from the die. External heat sink (not shown) may also be attached to the inactive surface of the die to further improve heat dissipation.

Package contacts 160 are disposed on the second surface 138b of the package pads disposed outside of the package substrate 102 as shown in FIGS. 1 and 2. The package contacts, for example, are spherical shaped structures or balls. Providing other types of package contacts, such as solder lands, may also be useful. The package contact is formed of a conductive material. The package contacts, for example, can be formed from solder. Various types of solder can be used to form the package contacts. For example, the solder can be a lead-based or non lead-based solder. Other types of conductive materials may also be used to form the package contacts.

The package contacts 160 provide external access to the die 110 via the package pads, conductive studs, conductive traces and die pads. The package may be electrically coupled to an external device (not shown), such as a circuit board, by the package contacts.

Figure 18:
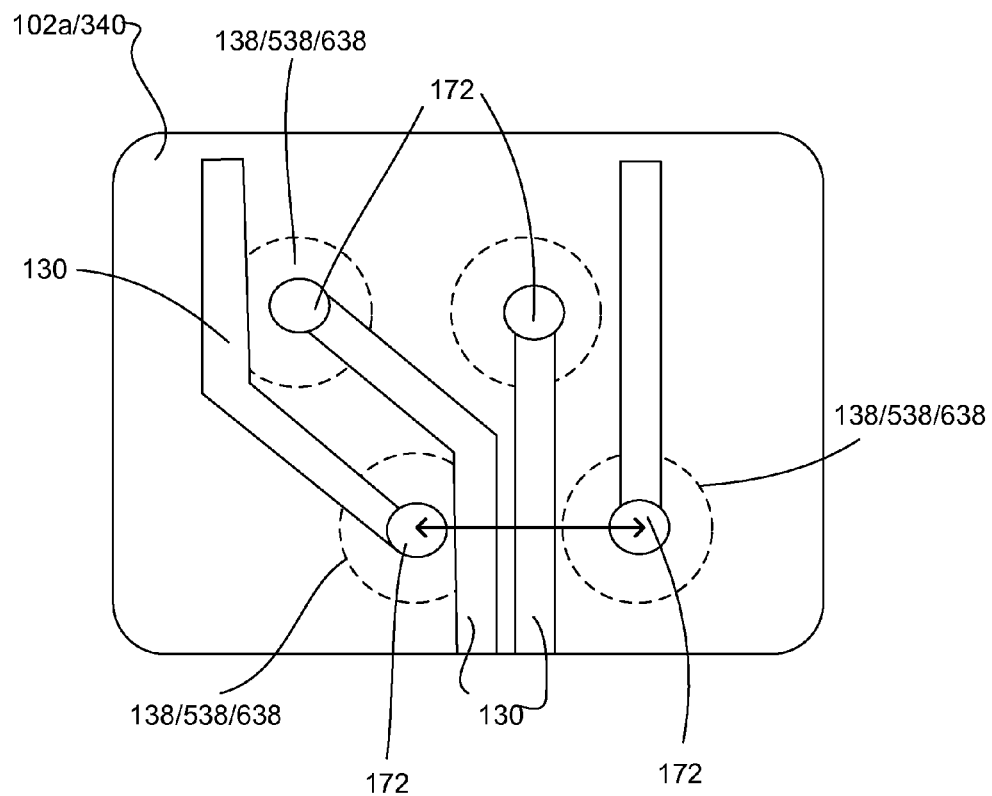
FIG. 18 shows top view of a first surface of the package substrate, illustrating an embodiment of an arrangement of the conductive studs and traces.

As described in the embodiments of FIGS. 1-2, the package pads are directly coupled to the conductive studs. The width of the conductive studs, as described, is smaller than the width of the package pads and the arrangement of the conductive stud which, for example, may be offset from the center of the package pad provide allowance for more traces to pass through the space between any of the two adjacent conductive studs, leading to more flexible and efficient routability of traces as illustrated in FIG. 18. Moreover, electrical resistance is lowered particularly where the interconnect structure of the package substrate, including the conductive traces, studs and package pads, is formed of a single low electrical resistance material, such as copper. This further enhances the performance of the semiconductor packages. Furthermore, the package pads are disposed or protruded outside of the bottom surface of the package substrate. This allows for stand-off type of package pads to be formed. Stand-off type of package pads enables solder climb during reflow, resulting in strong connection structure between the package and the PCB. The slight stand-off also creates a self-centering effect during reflow process, resulting in better board level reliability.

Figure 3:
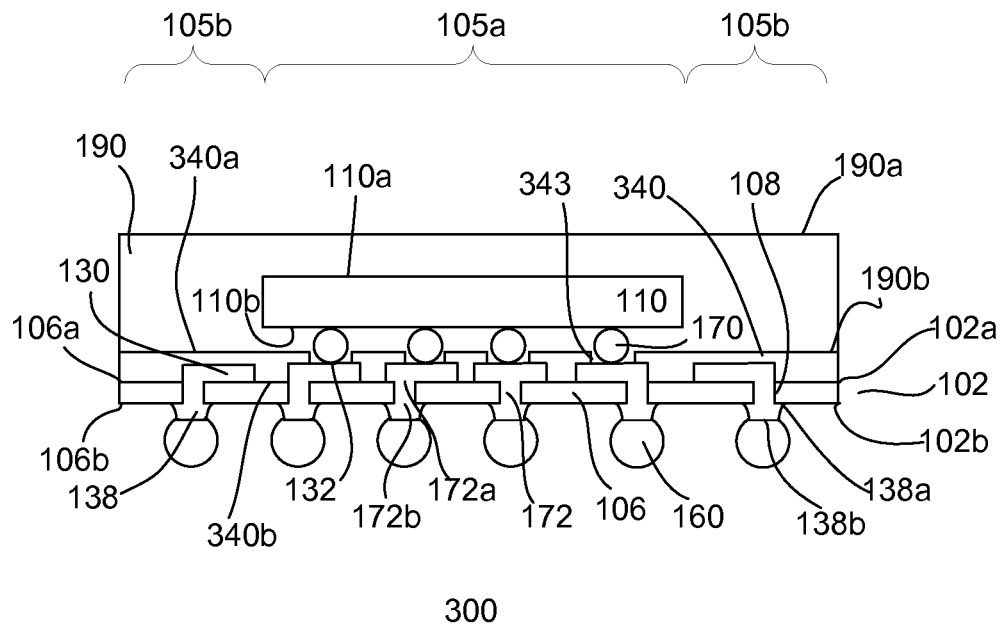
Figure 4:
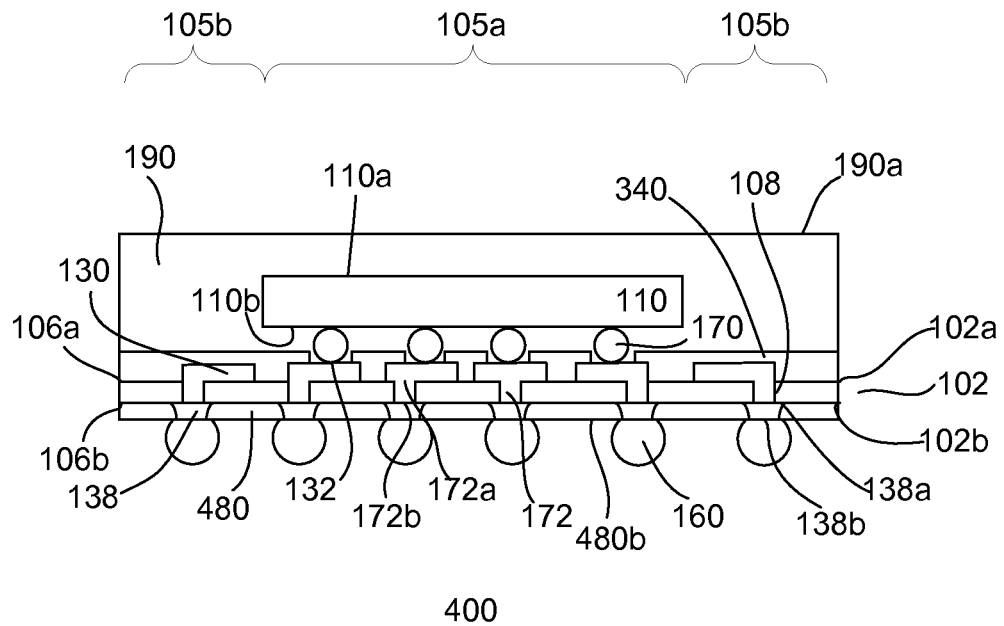
Figure 5:
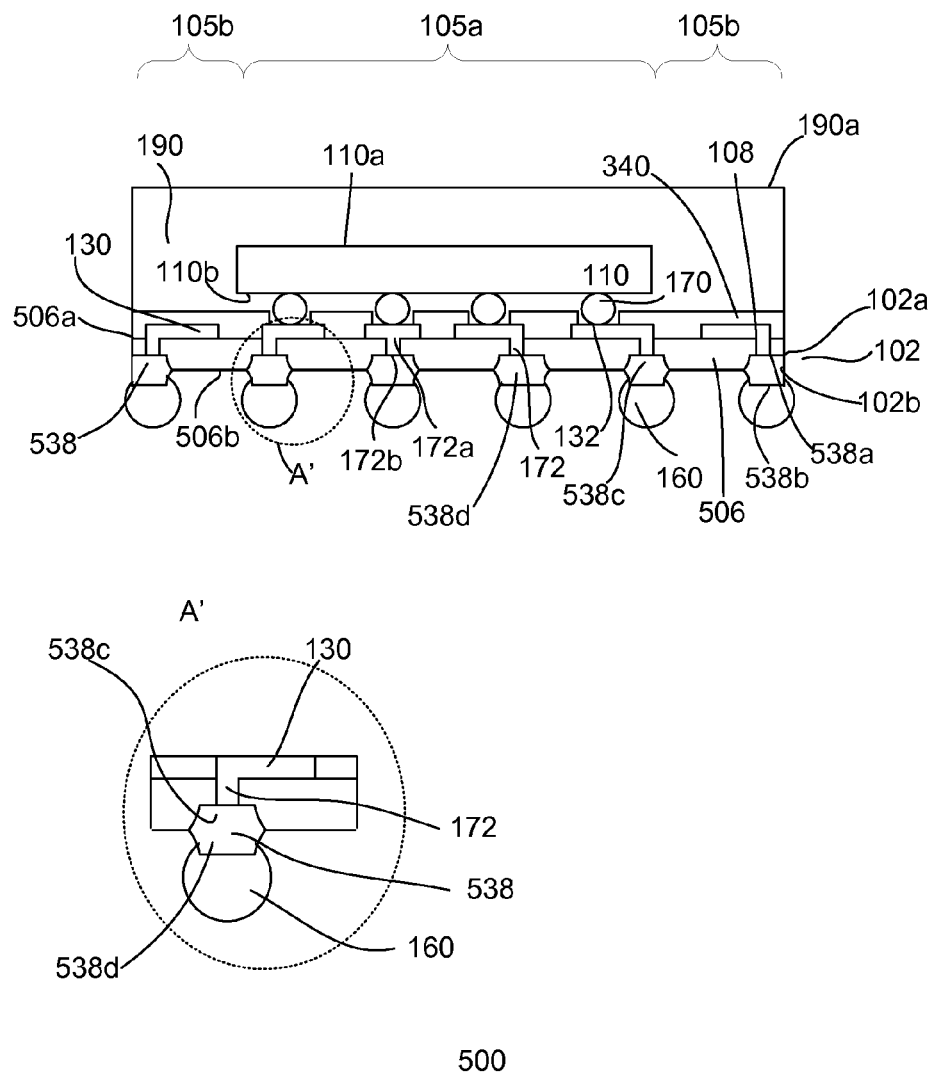

FIGS. 3-5 show cross-sectional views of other embodiments of the semiconductor package. The semiconductor package, as shown in FIGS. 3, 4 and 5, are similar to that described in FIGS. 1 and 2. Similar elements may not be described or described in detail. Each of the semiconductor packages 300, 400 and 500 differs from the semiconductor packages 100 and 200 in one or more aspects. In the interest of brevity, the description of the semiconductor package 300, 400 and 500 below primarily focuses on the difference(s) between each of the semiconductor packages 300, 400 and 500 and semiconductor packages 100 and 200.

Referring to FIG. 3, a protective layer 340 having first and second surfaces 340a-340b may optionally be disposed over the substrate layer 106. As shown in FIG. 3, the protective layer 340 is disposed over and partially covers the first surface 106a of the substrate layer including a portion of the conductive traces 130. In one embodiment, the protective layer includes a dielectric material. In one embodiment, the protective layer may include the same material as the substrate layer. For example, the protective layer includes a photo-imageable material, such as but not limited to solder mask or polyimide. Alternatively, the protective layer may include different dielectric material than the substrate layer of the package substrate. The protective layer may include any other suitable dielectric material and suitable thickness dimensions.

The protective layer 340, in one embodiment, includes openings 343 which are disposed within the die region and define locations where die contacts 170 of the die 110 are disposed therein. The openings 343, in one embodiment, extend from the first surface 340a and expose at least portions of the connection pads 132. The dimension of the openings, for example, may be larger than the dimension of the die contacts 170 disposed therein. In one embodiment, the protective layer overlaps with the connection pads at the peripheral area so that the connection pads are partially exposed from the protective layer. In another embodiment, no overlapping exists between the protective layer and the connection pads such that the entire connection pads are exposed from the protective layer.

As shown in FIGS. 1-3, package pads 138 are disposed or protruded outside of the second surface 102b of the package substrate. Referring to FIG. 4, an insulating layer 480 may optionally be disposed below the substrate layer 106 of the package substrate 102. As shown in FIG. 4, the insulating layer is disposed over the second surface 106b of the substrate layer 106. The insulating layer 480, in one embodiment, is disposed in between the exposed and protruded package pads 138. The insulating layer, for example, isolates the package pads. The insulating layer, for example, includes a dielectric material, such as but not limited to a mold compound and polyimide. Other suitable types of dielectric material which can function as a stress relief layer may also be used. The thickness of the insulating layer, in one embodiment, may be substantially the same as the thickness of the package pads. The bottom surface 480b of the insulating layer may be substantially coplanar with the bottom surface 138b of the package pads. In another embodiment, the thickness of the insulating layer may be thinner or thicker than the thickness of the package pads. Thus, the insulating layer completely or partially covers the sides of the package pads. The insulating layer may include any suitable thickness dimensions.

FIG. 5 shows simplified cross-sectional view of a different embodiment of a semiconductor package 500 with a portion A' in greater detail. In one embodiment, the package substrate includes a substrate layer 506 having first and second surfaces 506a-506b. As shown in FIG. 5, the package pads 538 include first and second major surfaces 538a-538b. The package pads, in one embodiment, include first and second portions 538c-538d. The first portion 538c of the package pads, in one embodiment, is disposed within the substrate layer 506. In one embodiment, the first portion 538c of the package pads is held together and surrounded by lower portion of the substrate layer 506. The second portion 538d of the package pads, in one embodiment, is disposed and protruded outside of the substrate layer 506. The second portion 538d of the package pads, as shown, extends beyond the second surface 102b of the package substrate. As shown in FIG. 5, the package pads 538 are partially engaged or held by portions of the substrate layer 506 and are partially protruded from the bottom or second major surface of the package substrate.

The embodiments described with respect to FIGS. 3-5 include some or all advantages as described with respect to FIGS. 1-2. As such, these advantages will not be described or described in detail. The package substrate as described in the embodiments of FIGS. 3-5 includes a protective layer over the package substrate. The protective layer, as described, includes openings of which die contacts of the die are disposed. As such, the protective layer may serve as a solder dam for the solder bumps, reducing uncontrolled flow of solder material during the reflow process which may lead to shorting. The insulating layer as described in the embodiment of FIG. 4, for example, can function as a stress relief layer that reduces the level of stress on the joint, such as solder joint, between the package pads and package contacts during reflow process or board level reliability test (TCoB). Thus, this leads to a more reliable package. Furthermore, the package pads as described in the embodiment of FIG. 5 are partially engaged or held by lower portions of the substrate layer of the package substrate. As such, the package pads will not be detached easily. This allows for improved robustness and package reliability.

Figure 6:
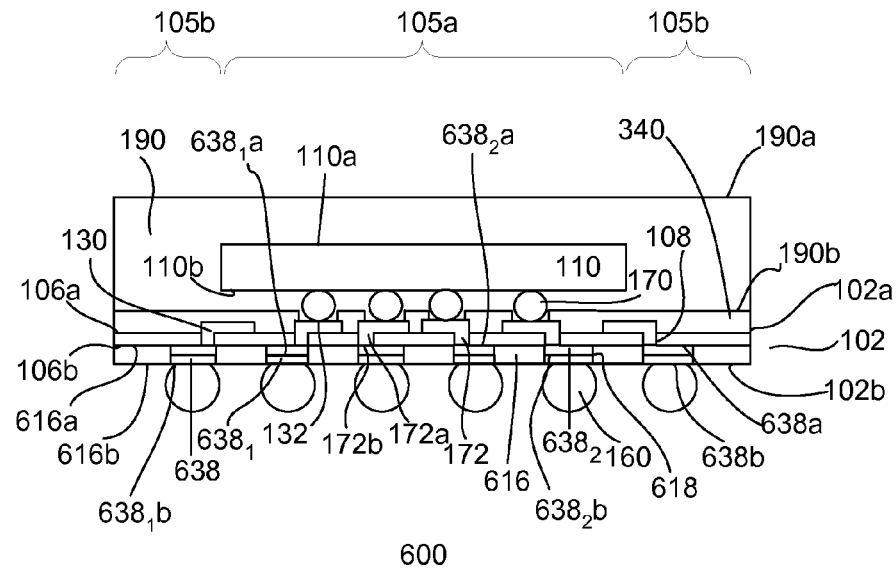
FIGS. 6-8 show various other embodiments of a semiconductor package.
Figure 7:
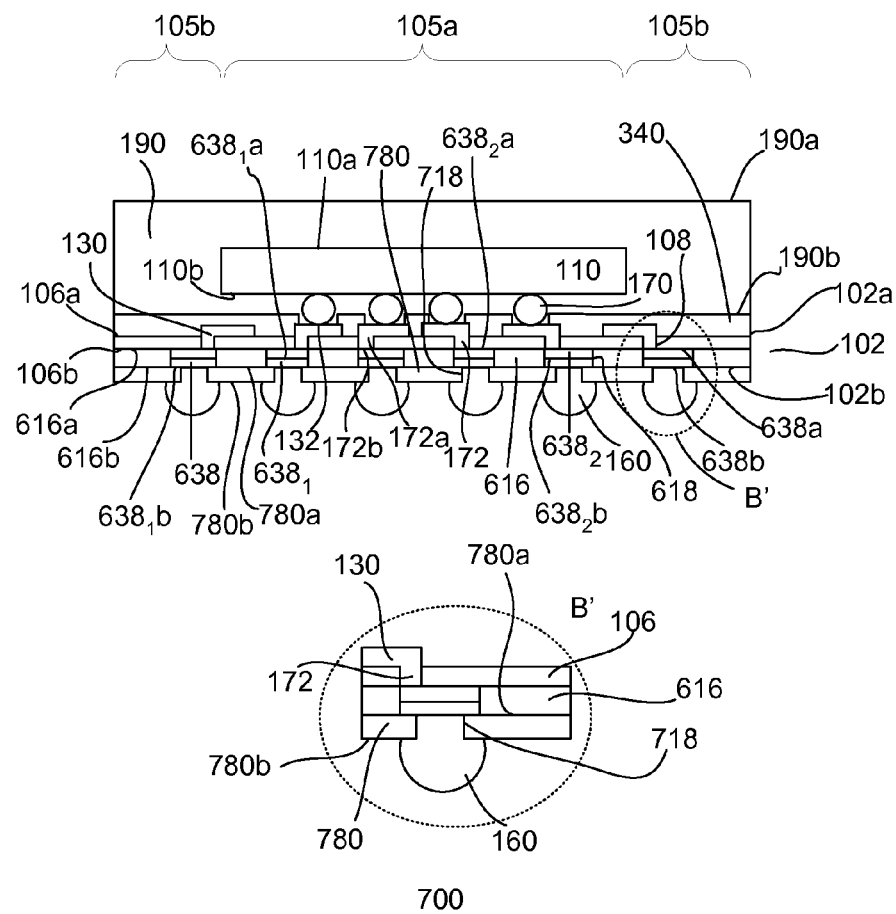
Figure 8:
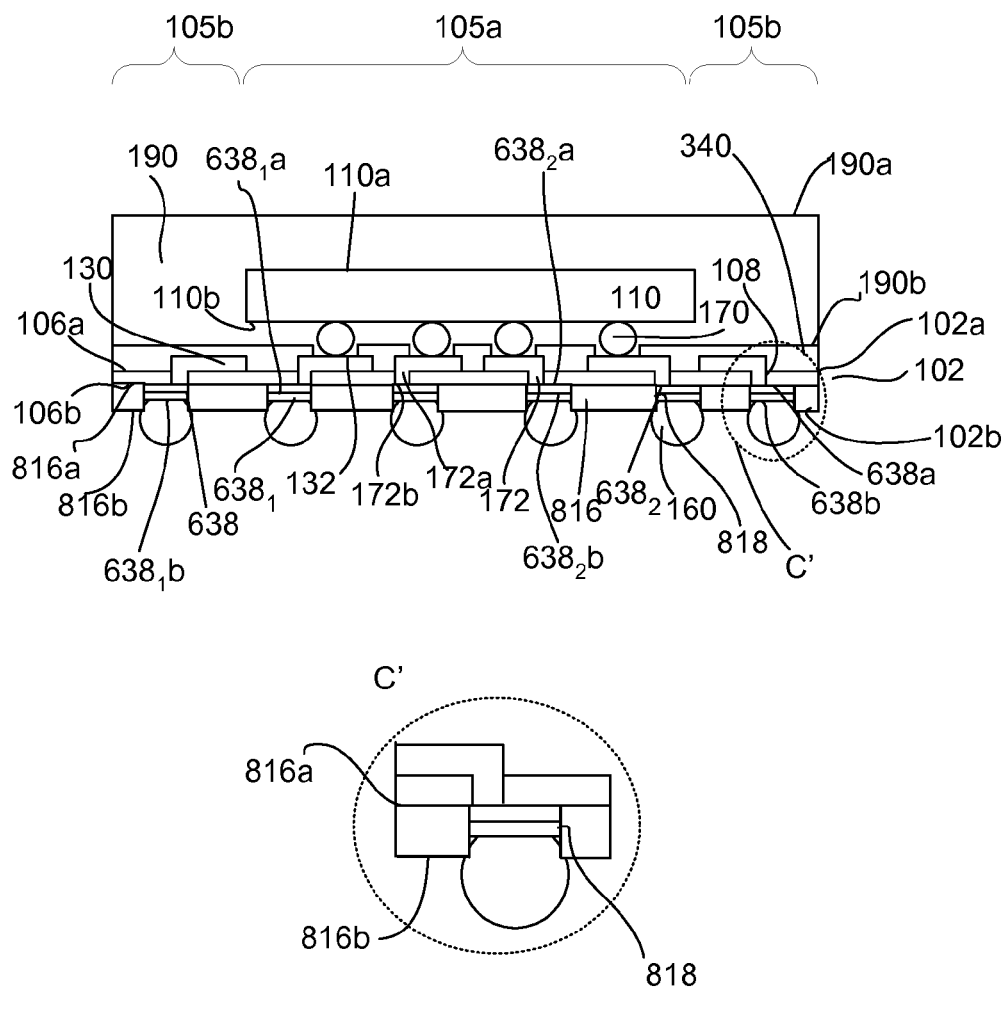

FIGS. 6-8 show cross-sectional views of various embodiments of a semiconductor package. The semiconductor packages 600, 700 and 800, as shown in FIGS. 6-8, are similar to those described in FIGS. 1-5. Similar elements may not be described or described in detail. The semiconductor packages 600-800 differ from the semiconductor packages 100-500 in one or more aspects. In the interest of brevity, the description of the semiconductor packages below primarily focuses on the difference(s) between the semiconductor packages 600-800 and semiconductor packages 100-500.

In one embodiment, the package substrate includes a multi-layered substrate as shown in FIG. 6. Referring to FIG. 6, the package substrate, in one embodiment, includes a first substrate layer 616 having first and second surfaces 616a-616b. The first substrate layer 616, in one embodiment, includes a first dielectric material. The first dielectric material, for example, includes photo-imageable material, such as but not limited to solder mask, or insulating layer, such as but not limited to polyimide, epoxy mold compound or inorganic insulating material. The thickness of the first substrate layer 616 defines the thickness of a part of the interconnect structure, such as package pads 638, which will be described later. The first substrate layer 616, in one embodiment, includes second type cavities 618, which define locations where package pads 638 are to be formed. The cavities 618, as shown in FIG. 6, extend from the first 616a to the second major surface 616b of the first substrate layer. The dimension of the cavities, for example, defines the dimension of the package pads. The package pads may include any suitable dimensions.

Referring to FIG. 6, package pads 638 are disposed within the second type cavities 618 of the first substrate layer 616. The package pads, for example, may include a single layered or a multi-layered stack. In one embodiment, the package pads include first and second conductive layers $638_1$ and $638_2$. Other number of conductive layers may also be useful.

In one embodiment, the first conductive layer $638_1$ includes a gold (Au) layer. Other suitable types of materials may also be employed as the first conductive layer, as long as it provides better adhesion to package contacts 160 to form a reliable joint, such as solder joint. The second conductive layer $638_2$ having first and second major surfaces $638_2a$-$638_2b$ is disposed over the first major surface $638_1a$ of the first conductive layer. The second conductive layer, in one embodiment, includes a material different than the first conductive layer. In one embodiment, the second conductive layer includes a nickel layer. Other suitable types of materials may also be used as the second conductive layer, so long as it can prevent metal migration between the adjacent metal materials, such as preventing migration between Au and Cu. The first and second conductive layers may include any suitable thickness dimensions.

Referring to FIG. 6, in one embodiment, the second surface $638_1b$ of the first conductive layer is substantially coplanar with the second surface 616b of the first substrate layer while the first surface $638_2a$ of the second conductive layer is substantially coplanar with the first surface 616a of the first substrate layer. Alternatively, the first surface of the second conductive layer, for example, may also be non-coplanar with the first surface of the first substrate layer. As shown in FIG. 6, the sides of the package pads 638, for example, are completely covered or enclosed by the first substrate layer.

In one embodiment, a second substrate layer 106 is disposed over the first substrate layer 616 as shown in FIG. 6. In one embodiment, the second substrate layer having first and second major surfaces 106a-106b is disposed over the first surface 616a of the first substrate layer 616. The first and second substrate layers 616 and 106, in one embodiment, form the package substrate 102. In one embodiment, the second substrate layer 106 includes a second dielectric material. The second dielectric material, in one embodiment, includes the same material as the substrate layer 106 as described in FIGS. 1-5. Thus, the material and thickness of the second substrate layer 106 are the same as the substrate layer 106 as described in FIGS. 1-5. In one embodiment, the second substrate layer 106 as shown in FIG. 6 may include the same material as the first substrate layer 616. For example, the first and second substrate layers may include polyimide. In another embodiment, the second substrate layer includes different material than the first substrate layer. For example, the second substrate layer is prepreg while the first substrate layer is solder mask. Other suitable types of materials may also be useful.

The thickness of the second substrate layer 106 may define the thickness of a part of the interconnect structure, such as conductive studs 172. In one embodiment, the second substrate layer 106 includes first type cavities 108 which define the locations where conductive studs of the package substrate are to be disposed, the same as the substrate layer described in FIGS. 1-5. Referring to FIG. 6, conductive studs 172 are disposed in the first type cavities 108 while conductive traces 130 and connection pads 132 are disposed over the top surface of the second substrate layer 106 and coupled to the conductive studs. The conductive studs, conductive traces and connection pads are the same as those described in FIGS. 1-5. Therefore, these common features will not be described in detail.

As shown in FIG. 6, package contacts 160 are coupled to the exposed bottom surfaces of the package pads 638b. In one embodiment, the package contacts are disposed and coupled to the exposed surfaces of the first conductive layer $638_1b$ of the package pads.

FIG. 7 shows cross-sectional view of another embodiment of a semiconductor package 700 with a portion B' in greater detail. The semiconductor package 700, as shown in FIG. 7, is similar to that described in FIG. 6. Similar elements may not be described or described in detail. In one embodiment, an insulating layer 780 is disposed over the second major surface 102b of the package substrate 102. For example, the insulating layer 780 is disposed over the second major surface 616b of the first substrate layer 616. In one embodiment, the insulating layer includes solder mask, mold compound or stress relief layer as described in FIG. 4. Other suitable types of insulating material and any suitable thickness dimension of the insulating layer may also be useful.

In one embodiment, the insulating layer includes a plurality of third type cavities 718. The third type cavities, in one embodiment, extend from the first 780a to the second surface 780b of the insulating layer 780. The third type cavities, in one embodiment, are disposed over the package pads. In one embodiment, the width of the third type cavities 718 may include any suitable dimension which is smaller than the width of the package pads, exposing portions of the bottom surface 638b of the package pads.

Referring to FIG. 7, package contacts 160 are coupled to the exposed portions of the package pads. For example, the package contacts are coupled to the exposed portions of the bottom surfaces $638_1b$ of the first conductive layer $638_1$ of the package pads. In one embodiment, top portions of the package contacts are also disposed within the third type cavities of the insulating layer.

FIG. 8 shows cross-sectional view of another embodiment of a semiconductor package 800 with a portion C' in greater detail. The semiconductor package, as shown in FIG. 8, is similar to that described in FIG. 6. Similar elements may not be described or described in detail. In one embodiment, the package substrate 102 includes a first substrate layer 816. The thickness of the first substrate layer 816 of FIG. 8, for example, includes any suitable thickness dimension.

The first substrate layer 816, as shown in FIG. 8, includes fourth type cavities or openings 818. The openings 818, in one embodiment, include substantially the same width as the package pads 638. Package pads 638, in one embodiment, are disposed within the openings 818 of the first substrate layer. The package pads, for example, may include the same material and thickness as that described in FIG. 6. Alternatively, the package pads as shown in FIG. 8 may include different thickness dimensions relative to the package pads shown in FIG. 6. In one embodiment, the second surface 638b of the package pads is non-coplanar with the second surface 816b of the first substrate layer while the first surface 638a of the package pads is substantially coplanar with the first surface 816a of the first substrate layer as shown in FIG. 8. The second surface 638b of the package pads, in one embodiment, is disposed above the second surface 816b of the first substrate layer of the package substrate. For example, the second surface $638_1b$ of the first conductive layer of the package pads is disposed above the second major surface 816b of the first substrate layer. A step is formed between the first substrate layer and the package pads. The sides of the package pads, as shown, are completely surrounded and engaged by the first substrate layer. The first substrate layer 816, for example, partially overlaps the package pads.

Referring to FIG. 8, package contacts 160 are coupled to the exposed portions of the package pads. For example, the package contacts are coupled to the exposed bottom surfaces 638b of the first conductive layer $638_1$ of the package pads. In one embodiment, top portions of the package contacts are also disposed within the openings 818 of the insulating layer.

The embodiments described with respect to FIGS. 6-8 include some or all advantages as described with respect to FIGS. 1-5. As such, these advantages will not be described or described in detail. The package substrate as described in the embodiments of FIGS. 6-8 includes package pads having more than one conductive layer. Different combinations of conductive layers are possible for the package pads. The sides of the package pads, for example, are at least partially or completely covered by the first substrate layer as described in FIG. 6. The package pads thus are at least engaged or held by the first substrate layer. Furthermore, the package pads as described in the embodiment of FIG. 7 are partially engaged or held by an insulating layer disposed below the first substrate layer. The insulating layer includes openings which expose only portions of the bottom surfaces of the package pads while the remaining portions of the bottom surfaces of the package pads are covered by the insulating layer. Thus, the insulating layer prevents the package pads to be detached, which further improves the package reliability. Similarly, the first substrate layer as described in the embodiment of FIG. 8 partially overlaps the package pads. This embodiment also avoids package pads to be detached.

Figure 9:
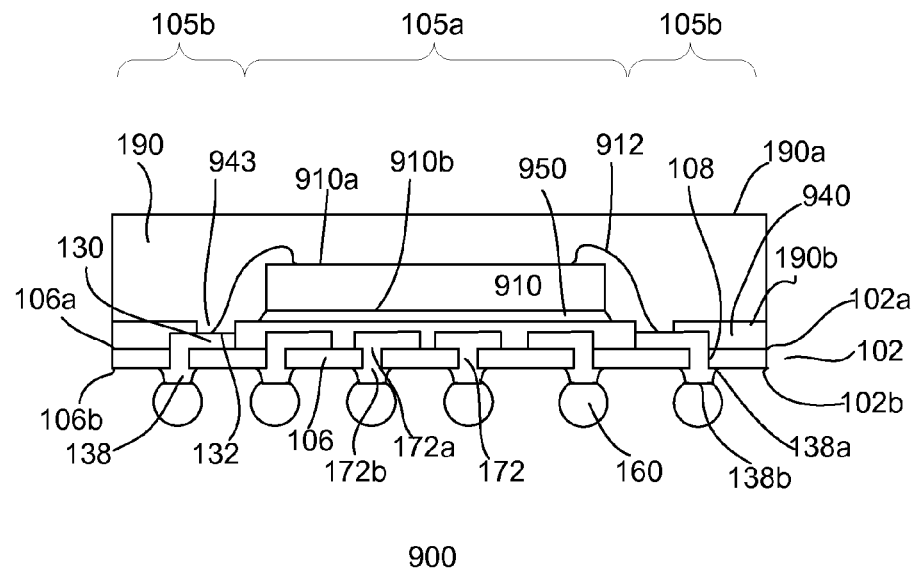
FIGS. 9-11 show various other embodiments of a semiconductor package.
Figure 10:
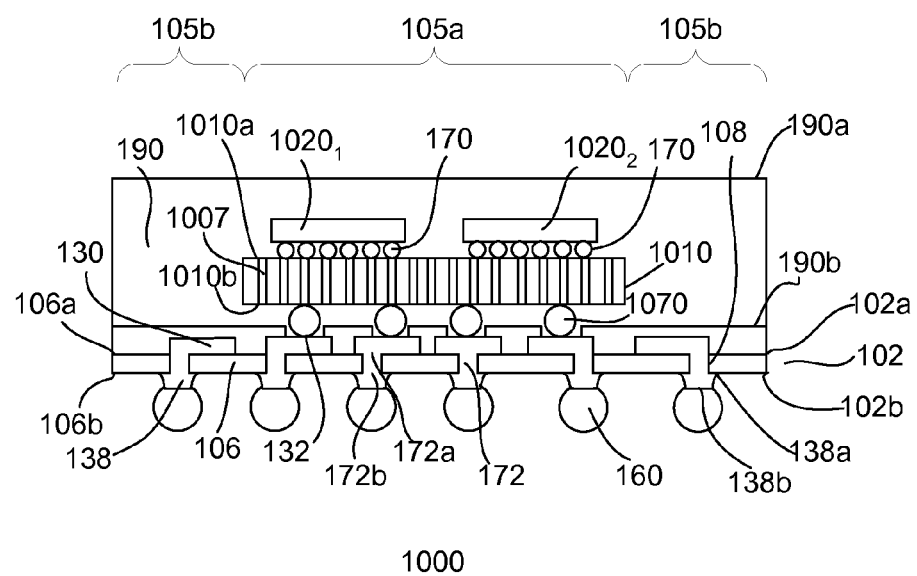
Figure 11:
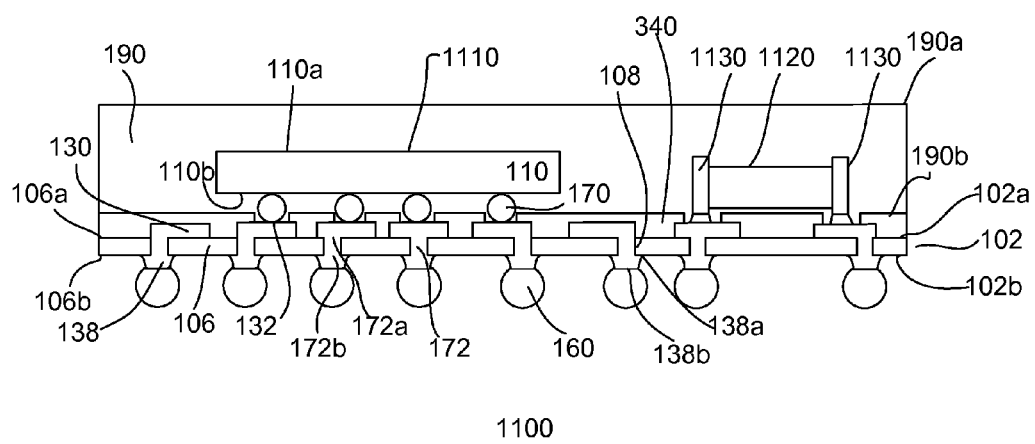

FIGS. 9-11 show cross-sectional views of various embodiments of a semiconductor package. The semiconductor packages, as shown in FIGS. 9-11, are similar to those described in FIGS. 1-8. Similar elements may not be described or described in detail. The semiconductor packages 900, 1000 and 1100 differ from the semiconductor packages 100-800 in one or more aspects. In the interest of brevity, the description of the semiconductor packages below primarily focuses on the difference(s) between each of the semiconductor packages 900-1100 and semiconductor packages 100-800.

The semiconductor packages, as shown in FIGS. 1-8, include a flip chip 110. It is understood that modifications may be made to any of the semiconductor packages 100-800 to provide non-flip chip type of semiconductor chip or die over the package substrate. Referring to FIG. 9, the semiconductor package 900 may include a wire bonded die 910. The die, as shown in FIG. 9, includes first and second major surfaces 910a-910b. The first surface 910a, for example, is an active surface of the die and the second surface 910b is an inactive surface of the die. Other designations for the surfaces of the die may also be useful. The active surface, for example, includes openings (not shown) in a final passivation layer to expose conductive die pads/contacts (not shown). The surfaces of the die pads, for example, are substantially coplanar with the first major surface of the die. Providing surfaces of the conductive pads which are not coplanar with the first major surface of the die may also be useful. The die pads provide connections to the circuitry of the die. The die pads, for example, are formed of a conductive material, such as copper, aluminum, gold, nickel or alloys thereof. Other types of conductive material may also be used for the die pads. The pattern of the die pads may be one or more rows disposed at the periphery of the active surface. Other pad patterns may also be useful.

The inactive surface of the die is mounted to the die region of the package substrate with the use of the adhesive layer 950. The adhesive layer, for example, may include an adhesive paste or die attach film, such as tape. Other types of adhesive, such as epoxy, may also be useful. In one embodiment, a protective or an insulating layer 940 may optionally be disposed over the substrate layer 106. The optional insulating layer 940 is used to electrically isolate the conductive traces and connection pads and provide mechanical protection for the traces. The optional insulating layer 940 includes openings 943 in the non-die region of the package substrate. The openings, in one embodiment, at least partially expose the conductive traces 130 and connection pads 132 in the non-die region 105b of the package substrate. In one embodiment, wire bonds 912 are provided to couple the die pads on the die to the connection pads 132 and conductive traces. In one embodiment, the wire bonds are coupled to the connection pads disposed in the non-die region near to the periphery of the package substrate. The connection pads, for example, include any suitable dimension, depending on the dimension of a stitch bond of the wire bond. The wire bonds create electrical connection between the connection pads, the conductive traces of the package substrate and die pads on the die.

The embodiments, as described in FIGS. 1-9, show a semiconductor package having either a flip chip type of die or a wire bonded type of die. It is understood that any of the semiconductor packages as described in FIGS. 1-9 may be modified to include other suitable types of dies, such as TSV type of dies or microelectromechanical systems chips. Other suitable types of dies may also be useful. The semiconductor packages, as illustrated in FIGS. 1-9, include a single die. It is understood that the semiconductor package, may also include a die stack. The semiconductor package 1000, in one embodiment, includes a die stack as shown in FIG. 10. The die stack includes x number of dies, where x is >2. In addition, it is understood that the dies of the die stack may be the same size or type. Providing a die stack having chips which are different types and/or sizes is also useful.

Referring to FIG. 10, the die stack includes a first type die 1010 and one or more second type of dies or devices 1020. The first type die, in one embodiment, includes a plurality of through silicon vias 1007 which extend from the first 1010*a* to the second major surface 1010*b* of the first type die. The first type die, for example, is a TSV type of die. The TSV type of die, in one embodiment, is a non-active type of die. In another embodiment, the TSV type of die may include active type of die. In one embodiment, the first type die includes a silicon die. The first type die may also include other suitable types of materials. The TSV type of die further includes top and bottom redistribution layers (not shown) and a plurality of die contacts 1070. The TSV die contacts, in one embodiment, include spherical solder balls. Other suitable types of die contacts for the TSV die, such as but not limited to conductive pillars, may also be useful.

As shown in FIG. 10, one or more second type of dies or devices 1020 may be vertically stacked over the first type die 1010. In one embodiment, two flip chips 1020$_1$ and 1020$_2$ are stacked over the first type die. The flip chips 1020$_1$ and 1020$_2$, for example, are the same type of flip chip 110 as that described in FIGS. 1-8. In another embodiment, there could be more than one type of devices being stacked over the first type die. Referring to FIG. 10, die contacts 170 of the two flip chips are coupled to connection pads (not shown) and to the top redistribution layers of the first type die. In the case where the first type die is a non-active type of die, the first type die serves as an interposer, providing electrical connection between the devices stacked thereon with the package substrate below it. The die contacts 170 of the second type dies, for example, are electrically coupled to the connection pads disposed on top of the package substrate through the first type die. Other suitable vertical stacking arrangements may also be useful.

The semiconductor package, as illustrated in FIG. 10 above, includes one or more dies or devices being vertically stacked to form a stacked package. It is understood that any of the semiconductor packages 100-900 may be modified such that one or more dies or devices may not be stacked vertically. The semiconductor package 1100, in one embodiment, includes one or more dies or devices being arranged in a planar arrangement as shown in FIG. 11. The semiconductor package includes y number of dies, where y is >2. In addition, it is understood that the dies or devices may be the same size or type. Providing dies or devices having different types and/or sizes is also useful.

In one embodiment, first and second types of devices are mounted over the top surface of the package substrate. The first type device 1110, in one embodiment, includes a flip chip 110 and the second type device 1120 includes a surface mount device (SMD) or component. The flip chip, for example, is the same as that described in FIGS. 1-8. The SMD, for example, includes resistors, capacitors and inductors. Other types of SMDs may also be useful. The first and second type devices may include other suitable types of devices. The flip chip and the SMD, for example, are disposed adjacent to each other. As shown in FIG. 11, the die contacts 170 of the flip chip are electrically coupled to the connection pads 132 of the package substrate 102 while the terminals 1130 of the SMD are electrically coupled to the connection pads which are dimensioned according to the size of the SMD terminals through the use of, for example, solder paste.

The embodiments described with respect to FIGS. 9-11 include some or all advantages as described with respect to FIGS. 1-8. As such, these advantages will not be described or described in detail. In addition, the protective layer 340, as shown in FIG. 11, provides a plurality of openings for exposing the connection pads and receiving the terminals of the SMD. As described, solder paste, for example, is applied within these openings and on the connection pads to join the SMD terminals to the connection pads. Without the protective layer, the solder paste may tend to flow towards adjacent connection pads and short with the solder paste. The protective layer therefore further functions as a dam to confine the flow of the solder paste, minimizing solder bridging on SMDs.

Figure 12F:
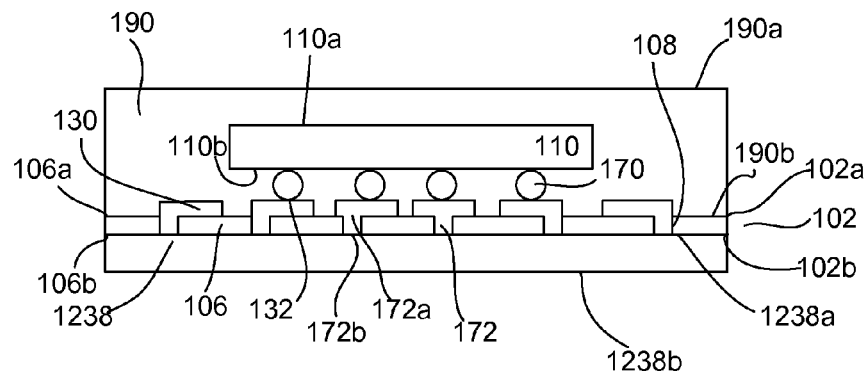

FIGS. 12*a*-12*h* show an embodiment of a method for forming a semiconductor package 1200. Referring to FIG. 12*a*, a base carrier 1238 is provided. The base carrier, in one embodiment, includes a conductive carrier having first and second major surfaces 1238*a*-1238*b*. The first major surface 1238*a*, for example, may be referred to as the top surface and the second major surface 1238*b*, for example, may be referred to as the bottom surface. Other designations for the surfaces may also be useful. The first and second major surfaces, for example, include planar surfaces. Providing any one of the major surfaces to be non-planar may also be useful. The conductive carrier, for example, includes Cu or Cu alloy. The conductive carrier, for example, includes suitable thickness dimensions and may serve as part of the interconnect structures, such as the package pads or conductive pads for accommodating a plurality of external package contacts, of a package substrate as will be described later.

The process continues to form a package substrate 102 and interconnect structure of the package substrate. Referring to FIG. 12*b*, the process continues to form a built-up or integrated wiring substrate. In one embodiment, the package substrate 102 includes a single layered substrate. In another embodiment, the package substrate includes a multi-layered substrate. In one embodiment, a substrate layer 106 having first and second major surfaces 106*a*-106*b* is provided over the first surface 1238*a* of the base carrier. As shown, the second major surface 106*b* of the substrate layer contacts the first major surface 1238*a* of the base carrier. In one embodiment, the substrate layer includes a dielectric material. The substrate layer 106, for example, includes photo-imageable material, such as but not limited to solder mask, or insulating film, such as but not limited to polyimide, epoxy mold compound or other inorganic material. The substrate layer, for example, is formed over the base carrier by spin coating, lamination, vacuum deposition, etc. Other suitable types of dielectric material and techniques for forming the substrate layer may also be useful.

The process continues to remove portions of the substrate layer. FIG. 12*c*$_1$ shows the cross-sectional view while FIG. 12*c*$_2$ shows the top view of the substrate layer. In one embodiment, the substrate layer is patterned to create first type cavities 108 which define the locations where conductive studs of the package substrate are to be formed. As shown, the cavities 108 extend from the first 106a to the second major surface 106b of the substrate layer. The dimension of the cavities, for example, defines the dimension of the conductive studs to be formed later. The width of the cavities, for example, is smaller than a width of package pads as will be described later.

Patterning of the substrate layer may be performed with the use of a patterned masked layer (not shown). Patterning of the substrate layer can be achieved by any suitable mask and etch techniques. For example, a patterned etch mask (not shown), such as photoresist, is provided over the substrate layer. An etch may be performed using the etch mask to remove portions of the substrate layer unprotected by the etch mask, exposing portions of the top surface 1238a of the conductive carrier. The etch, for example, may be an isotropic etch, such as a wet etch. An anisotropic etch, such as reactive ion etch (RIE) may be used. Alternatively, if the substrate layer includes a photo-imageable material, exposure with the assistance of mask and development by organic solvent can also be used to form the pattern in the substrate layer. Other techniques for forming the cavities, such as but not limited to laser drilling, may also be useful.

The process continues to form interconnect structures of the package substrate. Referring to FIG. 12d, the process continues to form conductive studs 172 in the openings 108 and over the exposed portions of the top surface 1238a of the base carrier. In one embodiment, the conductive studs 172 may be formed of a single conductive material. The conductive studs, in one embodiment, include the same material as the base carrier. In another embodiment, the conductive studs may be formed of two or more conductive materials, forming a multi-layered stack. Other suitable types of conductive materials may also be useful.

In one embodiment, the conductive studs 172 are formed by plating. For example, electrochemical or electroless plating may be employed to form the conductive studs. Thus, one or more layer may be plated to form the conductive studs. The first surface 1238a of the base carrier thus also serves as a base or substrate for the electroplating process. In one embodiment, the conductive studs 172 may be formed by electrochemical plating in which the base carrier serves as a plating current conducting path in the process. Other suitable methods for forming the conductive studs may also be used. The thickness of the conductive studs, for example, may be about the same as or lower than the thickness of the substrate layer. For example, the top surface 172a of the conductive studs may be substantially coplanar with the top surface 106a of the substrate layer.

The process continues to form conductive traces 130 and connection pads 132 of the package substrate as shown in FIG. 12d. In one embodiment, the conductive traces and connection pads are formed of the same material as the conductive studs. Other types of conductive materials, such as different than the conductive studs, may also be useful. The conductive traces and connection pads, in one embodiment, are formed by plating. For example, electrochemical or electroless plating may be employed to form the conductive traces and connection pads. The first surface 172a of the conductive studs thus also serves as a base or substrate for the electroplating process. Other suitable methods for forming the conductive traces and connection pads may also be used. For example, the conductive traces may also be formed by lamination, vacuum deposition, etc., followed by an etching process. The thickness of the conductive traces or connection pads, for example, may be as low as about 5 μm. Other suitable dimensions may also be useful.

The substrate layer 106 which serves as the package substrate includes a die region 105a defined on which a die 110 is to be attached. In one embodiment, the connection pads 132 are disposed within the die region. Providing connection pads on the periphery of the die region, such as non-die regions may also be useful. Other configurations of the connection pads may also be useful. As shown, the conductive traces and connection pads are formed over the substrate layer and top surface of the conductive studs in the die and non-die regions of the package substrate and are electrically coupled to the conductive studs.

A flip chip 110 having die contacts 170 on an active surface 110b of the die is mounted onto the die region of the package substrate. FIG. 12$e_1$ shows the cross sectional view while FIG. 12$e_2$ shows the top view of the flip chip being mounted onto the package substrate. The connection pads, in the case of a flip chip application, are disposed in the die region of the package substrate. The connection pads, as shown, are configured to match the pattern of the die contacts of the flip chip. An underfill (not shown), such as an epoxy-based polymeric material, may be provided in the space between the flip chip and the package substrate. Alternatively, no underfill is provided between the flip chip and the package substrate.

A cap 190 is formed on the package substrate as shown in FIG. 12f. For example, an encapsulation material is dispensed to encapsulate the flip chip. For example, an encapsulation material is dispensed to fill the spaces between the die contacts and cover the inactive surface 110a of the flip chip. In one embodiment, the encapsulation is a mold compound, such as molding epoxy resin material. Providing other types of encapsulation materials may also be useful.

The cap, in one embodiment, is formed by transfer molding techniques. Encapsulation material, such as a mold compound, is dispensed into the mold assembly, surrounding the sides and covering the inactive surface of the flip chip to form the cap as shown in FIG. 12f. After molding, the molded die is separated from the mold. Other suitable types of techniques for forming the cap may also be useful. For example, the cap may also be formed by printing or compression molding.

In another embodiment, the cap is formed by a film assisted transfer molding technique. For example, a film is placed against contours of a mold (not shown). In one embodiment, when the package substrate and the die are placed against the mold, the film contacts the inactive surface of the flip chip. The cap surrounds the sides of the flip chip, leaving the inactive surface of the flip chip exposed to form a semiconductor package similar to that shown in FIG. 2. As such, the first surface of the cap 190a is substantially coplanar with the inactive surface 110a of the flip chip. By providing a cap which does not cover the inactive surface of the die helps improves the heat dissipation from the die. External heat sink may also be attached to the inactive surface of the die to further improve heat dissipation.

Figure 12G:
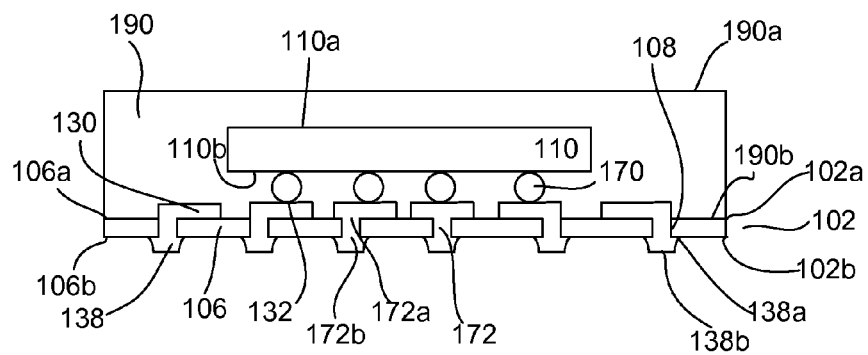

The process continues to form package pads 138 of the package substrate as shown in FIG. 12g. In one embodiment, the package pads 138 of the package substrate are formed by patterning the conductive carrier 1238. The encapsulated structure thus provides mechanical support during patterning of the conductive carrier. Patterning of the conductive carrier may be performed with the use of a patterned masked layer (not shown). Patterning of the conductive carrier can be achieved by any suitable etching techniques. For example, a patterned etch mask (not shown), such as photoresist, is provided over the second surface of the conductive carrier. An etch may be performed using the etch mask to remove portions of the conductive carrier unprotected by the etch mask. The etch, for example, may be an isotropic etch, such as a wet etch. Other techniques for patterning the conductive carrier may also be useful. The thickness of the package pads 138 as formed, for example, is substantially the same as the thickness of the conductive carrier. The package pads, for example, may also include other suitable thicknesses. The package pads 138 are coupled to the conductive traces 130 via the conductive studs 172 as shown in FIG. 12g. In one embodiment, the package pads as formed are disposed or protruded outside of the substrate layer 106. As shown, the package pads as formed are disposed over the second surface 106b of the substrate layer. The package pads, as shown, protrude from the bottom or second surface of the package substrate.

After patterning the conductive carrier, the mask is removed. The mask, for example, may be removed by ashing. Other techniques for removing the mask may also be useful.

Figure 12H:
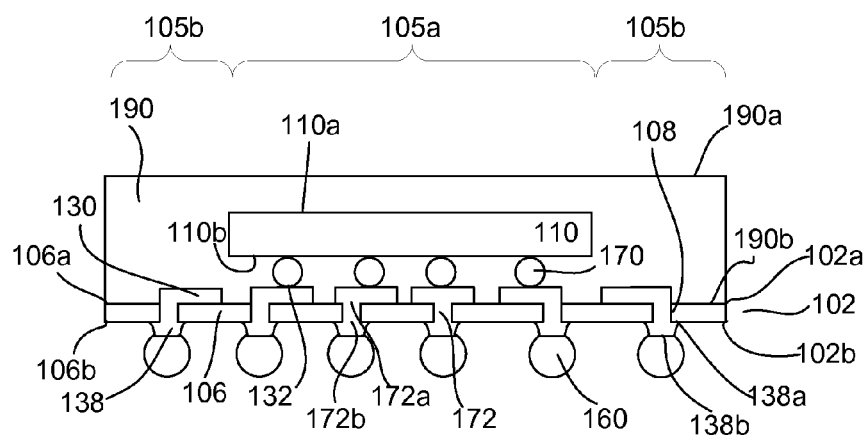

The process continues by forming package contacts 160 coupled to the package pads, as shown in FIG. 12h. For example, the package contacts are formed and coupled to the package pads. The package contacts, for example, may include spherical shaped structures or balls arranged in grid pattern to form a BGA type package. As such, a semiconductor package such as that shown in FIG. 1 is formed. The package contacts are formed of a conductive material. The package contacts, for example, can be formed from solder. Various types of solder can be used to form the package contacts. For example, the solder can be a lead-based or non lead-based solder. In some embodiments, other types of package contacts, such as but not limited to solder lands, are coupled to the package pads. The package contacts may be formed of materials other than solder or using other techniques.

Figure 13A:
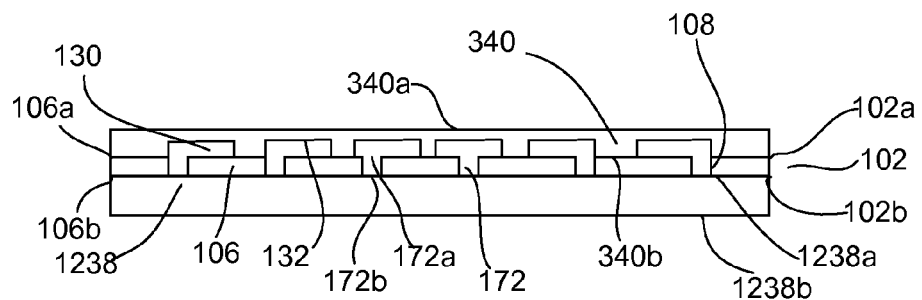
Figure 13B:
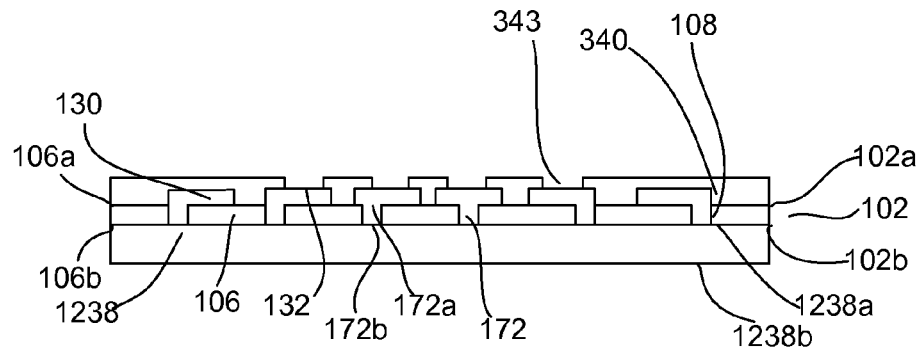
Figure 13C:
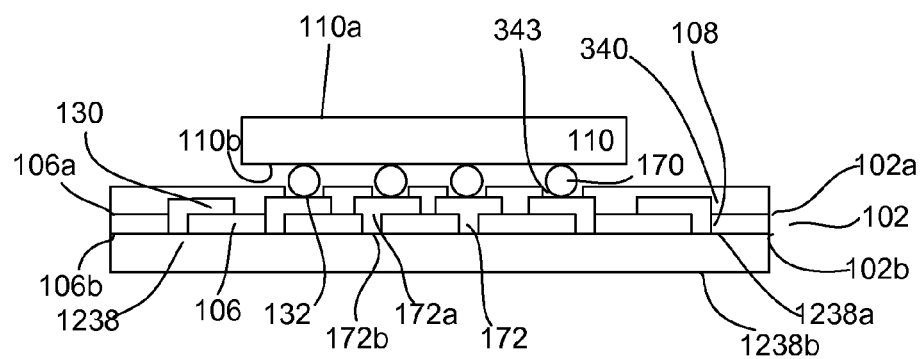

FIGS. 13a-13c show another embodiment of a process for forming a semiconductor package 1300. The process includes similar process to that described in FIGS. 12a-12h. As such, common processes may not be described or described in detail. Referring to FIG. 12a, a partially processed package substrate is provided. The partially processed package substrate is similar to that described in FIG. 12d. The materials, thickness and process for forming the partially process package substrate are the same as that described in FIG. 12d. As such, common elements may not be described or described in detail.

In one embodiment, a protective layer 340 may optionally be provided over the package substrate 102. Referring to FIG. 13a, the protective layer is formed over and covers the first major surface 106a of the substrate 106 layer including the conductive traces 130. In one embodiment, the protective layer includes a dielectric material. The protective layer, for example, may include the same dielectric material as the substrate layer. For example, the protective layer includes a photo-imageable material, such as but not limited to solder mask or polyimide. Alternatively, the protective layer may include different dielectric material than the substrate layer of the package substrate. The protective layer may include any suitable thickness dimensions. The protective layer, for example, may be formed by spin coating technique. Other types of dielectric materials and deposition techniques may also be useful for forming the protective layer.

The process continues to remove portions of the protective layer as shown in FIG. 13b. In one embodiment, the protective layer is patterned to create openings 343 which define the locations where die contacts 170 of a die are to be disposed. As shown, the openings 343 extend from the first 340a to the second major surface 340b of the protective layer. The dimension of the openings, for example, includes any suitable dimension which may be larger than the dimension of the die contacts 170 to be disposed later.

Patterning of the protective layer may be performed with the use of a patterned masked layer (not shown). Patterning of the protective layer can be achieved by any suitable etching techniques. For example, a patterned etch mask (not shown), such as photoresist, is provided over the protective layer. An etch may be performed using the etch mask to remove portions of the protective layer unprotected by the etch mask, exposing at least portions of the connection pads 132 which will be coupled to the die contacts 170 later. The etch, for example, may be an isotropic etch, such as a wet etch. An anisotropic etch, such as reactive ion etch (RIE) may be used. Alternatively, if the protective layer includes a photo-imageable material, exposure with the assistance of mask and development by organic solvent can also be employed to form the pattern in the protective layer. Other techniques for forming the cavities in the protective layer, such as but not limited to laser drilling, may also be useful.

Referring to FIG. 13c, a flip chip 110 having die contacts 170 on an active surface 110b of the die is mounted onto the die region of the package substrate. In one embodiment, the die contacts 170 are disposed within the openings 343 of the protective layer and are coupled to the exposed connection pads. Thus, the protective layer having the openings, for example, serves as a dam for accommodating the die contacts of the flip chip.

The process continues, as similarly described in FIG. 12f and onwards. As such, these process steps will not be described or described in detail. The process continues until a package similar to that shown in FIG. 3 is formed.

Figure 14A:
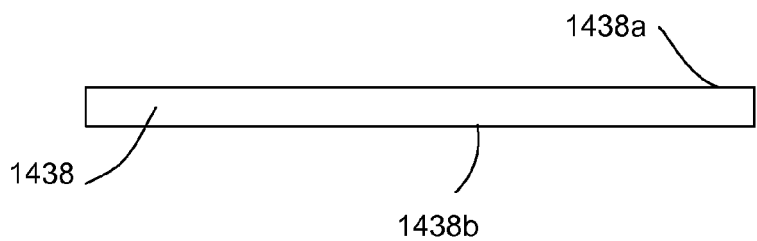

FIGS. 14a-14k show another embodiment of a process for forming a semiconductor package 1400. The process includes similar process to that described in FIGS. 12a-12h. As such, common processes may not be described or described in detail. Referring to FIG. 14a, a base or conductive carrier 1438 is provided. The conductive carrier is the same to that described in FIG. 12a. The materials and features of the conductive carrier are the same as that described in FIG. 12a. As such, common elements may not be described or described in detail.

Figure 14B:
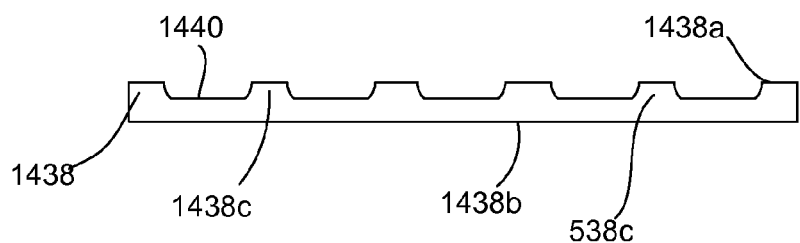

Referring to FIG. 14b, the first major surface 1438a of the conductive carrier, in one embodiment, is processed to create a topography which defines package pad regions as well as non-package pads regions. For example, package pad regions of the package substrate, for example, may be referred to areas where package pads are formed while non-package pad regions may be referred to areas where no package pads are formed. In one embodiment, the first major surface 1438a is processed such that it includes a non-planar surface having protruded portions 1438c and a plurality of recesses 1440. The protruded portions define locations under which package pads are formed while the recesses define locations under which no package pads are to be formed. In one embodiment, the protruded portions 1438c define the first or top portions 538c of the package pads. The depth of the recesses, for example, defines the depth of the first portion of the package pad.

Patterning of the first major surface may be achieved using, for example, mask and etch techniques. The etch, for example, includes a wet etch. Other suitable techniques for patterning the first major surface may also be useful.

Figure 14C:
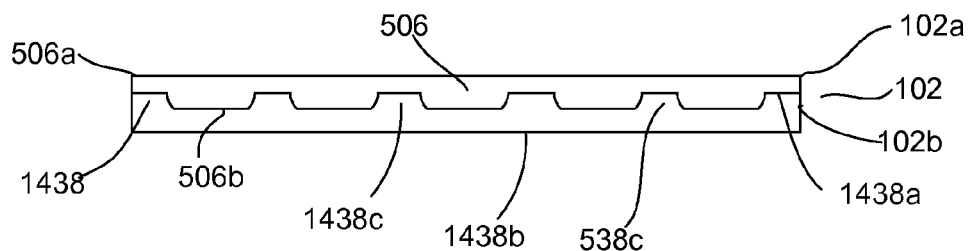

The process continues to form a package substrate and interconnect structure of the package substrate. Referring to FIG. 14c, the process continues to form a built-up or integrated wiring substrate. In one embodiment, the package substrate includes a single layered substrate. In another embodiment, the package substrate includes a multi-layered substrate. In one embodiment, a substrate layer 506 is provided over the first surface 1438a of the conductive carrier. As shown, the substrate layer 506 covers the first major surface of the conductive carrier, including the recesses 1440. The materials and process for forming the substrate layer, for example, are the same as that described in FIG. 12b. Other suitable types of dielectric material and techniques for forming the substrate layer may also be useful. The thickness of the substrate layer 506, for example, includes any suitable dimension.

Figure 14D:
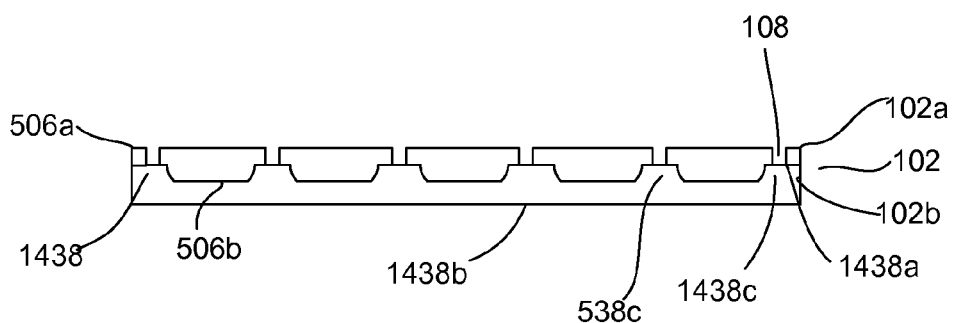

Referring to FIG. 14d, the process continues to remove portions of the substrate layer 506. In one embodiment, the substrate layer is patterned to create cavities 108 which define the locations where conductive studs of the package substrate are to be formed. In one embodiment, the cavities 108 are formed over the protruded portions 1438c. As shown, the cavities extend from the first surface 506a and expose portions of the top surface of the protruded portions. The dimension of the cavities, for example, defines the dimension of the conductive studs to be formed later. Features of the cavities and technique used for forming the cavities 108, for example, are the same as that described in FIG. 12c. Other suitable dimensions of the cavities and techniques may also be used to form the cavities.

Figure 14E:
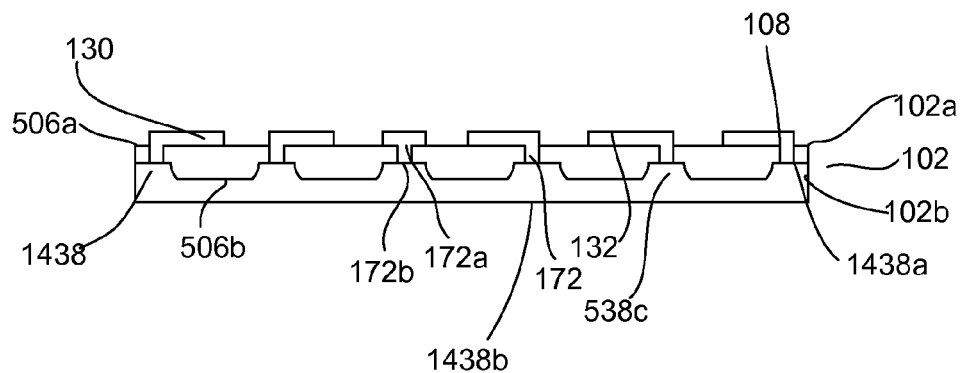

The process continues to form interconnect structures of the package substrate. Referring to FIG. 14e, the process continues to form conductive studs 172 in the openings 108 and over the exposed protruded portions 1438c of the top surface of the base carrier. In one embodiment, the conductive studs are formed by plating. The exposed protruded portions of the first surface of the base carrier thus also serve as a base or substrate for the plating process. Other suitable methods for forming the conductive studs may also be used.

The process continues to form conductive traces 130 and connection pads 132 of the package substrate as shown in FIG. 14e. The features of the conductive studs, conductive traces and connection pads and the forming techniques, for example, are similar to that described in FIG. 12d. As such, these features will not be described or described in detail.

Figure 14F:
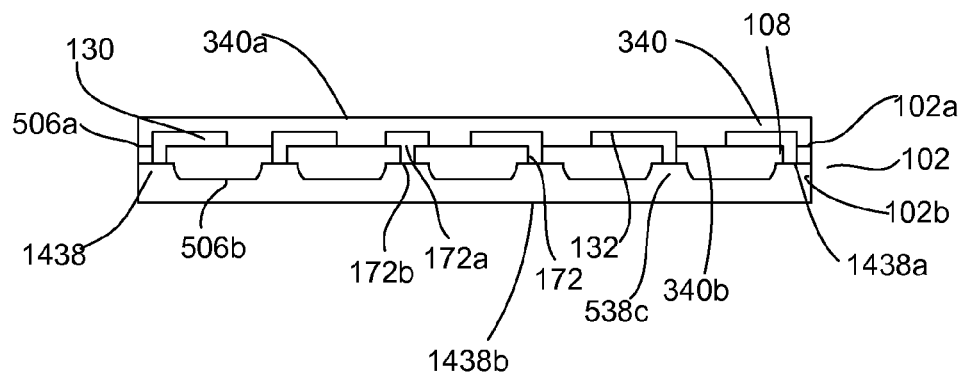
Figure 14G:
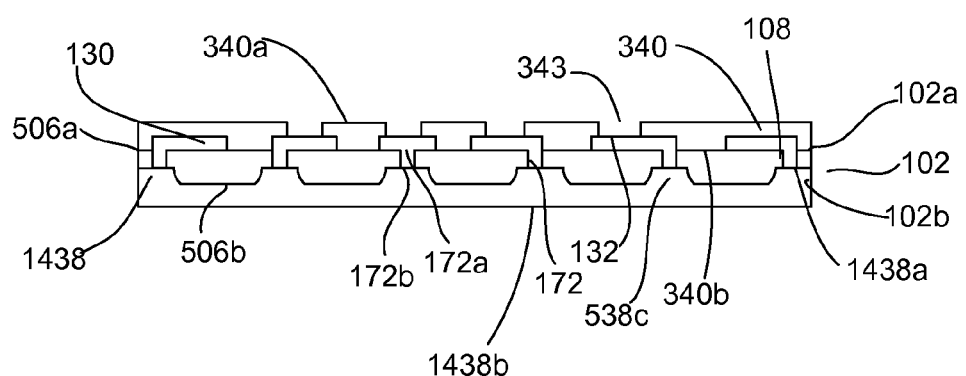

A protective layer 340 may optionally be provided over the package substrate 102 as shown in FIG. 14f. The protective layer, as shown, is formed over and covers the first major surface 506a of the substrate layer including the conductive traces and connection pads. The process continues to remove portions of the protective layer 340 as shown in FIG. 14g. In one embodiment, the protective layer is patterned to create openings 343 which define the locations where die contacts of a die are to be disposed. The materials, features and technique for forming the protective layer and its openings, for example, are the same as that described in FIGS. 13a-13b. As such, common elements may not be described.

Figure 14H:
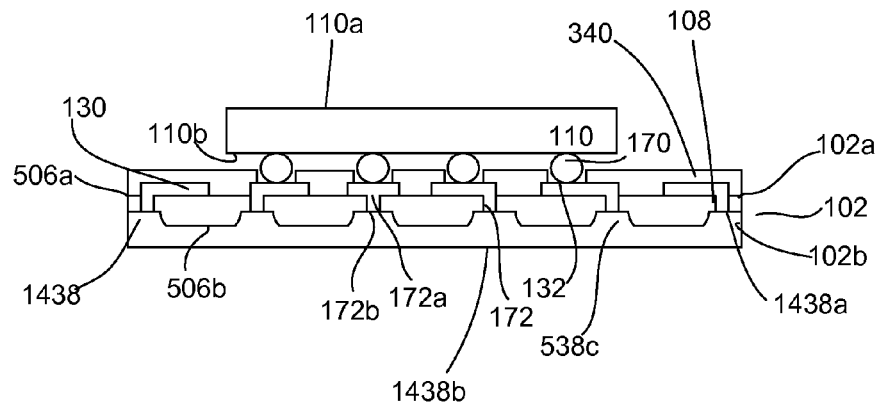
Figure 14I:
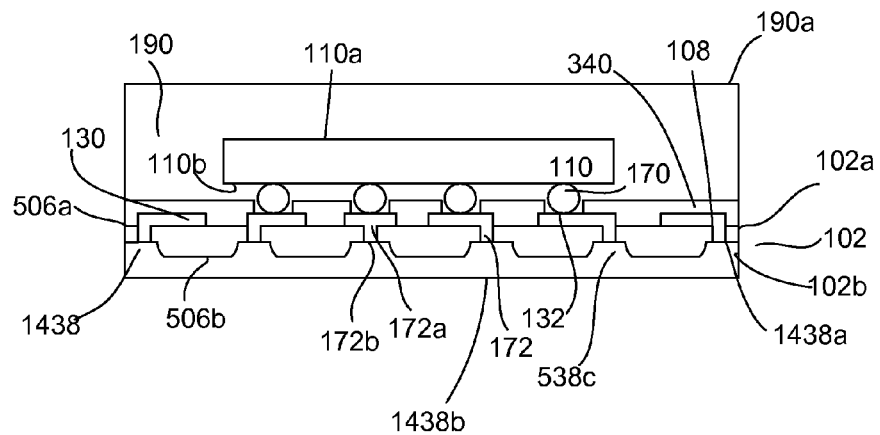

Referring to FIG. 14h, a flip chip 110 having die contacts 170 on an active surface 110b of the die is mounted onto the die region of the package substrate 102. The die contacts 170 are disposed within the openings 343 of the protective layer and are coupled to the exposed connection pads 132. Thus, the protective layer having the openings 343 serves as a dam for accommodating the die contacts of the flip chip. Referring to FIG. 14i, the process continues to form a cap 190 to cover over the package substrate, the same as that described in FIG. 12f.

Figure 14J:
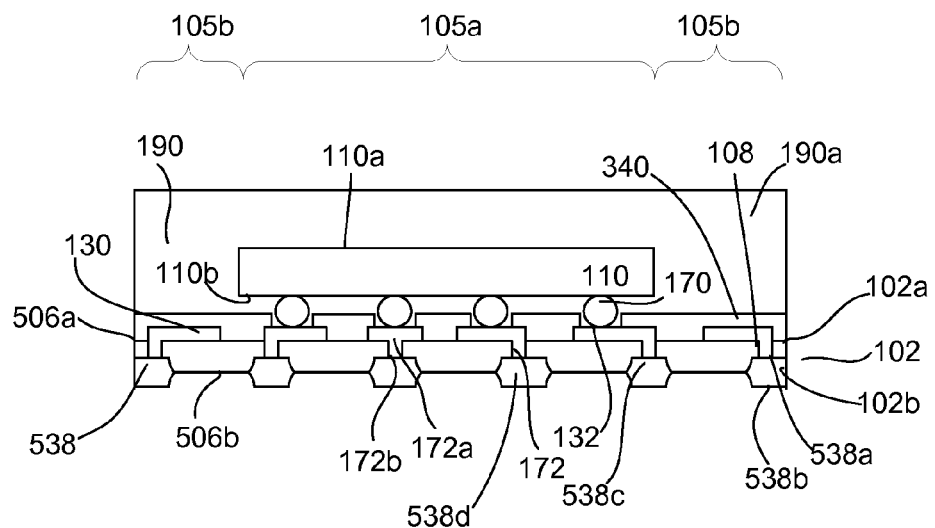

The process continues to form package pads of the package substrate by removing portions of the conductive carrier. In one embodiment, the removal is achieved by patterning the second surface 1438b of the conductive carrier as shown in FIG. 14j. The encapsulated structure thus provides mechanical support during patterning of the conductive carrier. Patterning of the conductive carrier may be performed with the use of a patterned masked layer (not shown). Patterning of the conductive carrier can be achieved by any suitable etching techniques. For example, a patterned etch mask (not shown), such as photoresist, is provided over the second surface 1438b of the conductive carrier. The patterned etch mask (not shown), in one embodiment, includes openings (not shown) which exposes portions of the conductive carrier below the recesses 1440. An etch may be performed using the etch mask to remove portions of the conductive carrier unprotected by the etch mask. The etch, for example, may be an isotropic etch, such as a wet etch. Other techniques for patterning the conductive carrier may also be useful. The etch, for example, removes the exposed portions of the conductive carrier and stops at portions of the substrate layer in the recesses 1440. Thus, the substrate layer serves as an etch stop or barrier layer during the removal of the exposed portions of the conductive carrier below the recesses. The remaining portions of the conductive carrier serve as the bottom portions 538d of the package pads.

The thickness of the package pads 538 as formed, for example, is substantially the same as the thickness of the conductive carrier. The package pads, for example, may also include other suitable thicknesses. The package pads 538 are coupled to the conductive traces via the conductive studs 172 as shown in FIG. 14j. In one embodiment, a first or top portion 538c of the package pads is formed within the substrate layer 506. In one embodiment, the first portion 538c of the package pads is held together and surrounded by lower portion of the substrate layer. The second or bottom portion 538d of the package pads, in one embodiment, is disposed or protruded outside of the substrate layer. As shown, the package pads are partially engaged by portions of the substrate layer and are partially protruded from the bottom or second surface 506b of the package substrate.

After patterning the conductive carrier, the mask is removed. The mask, for example, may be removed by ashing. Other techniques for removing the mask may also be useful.

Figure 14K:
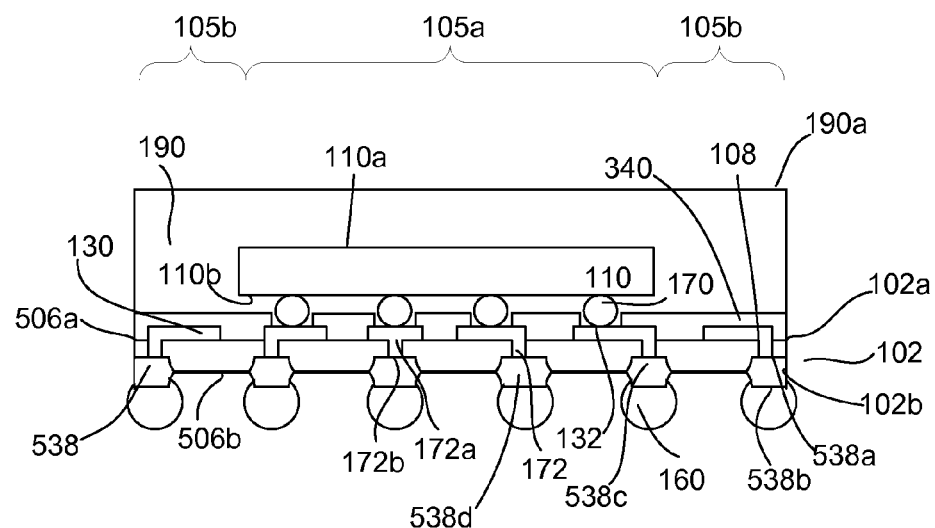
Figure 14I:
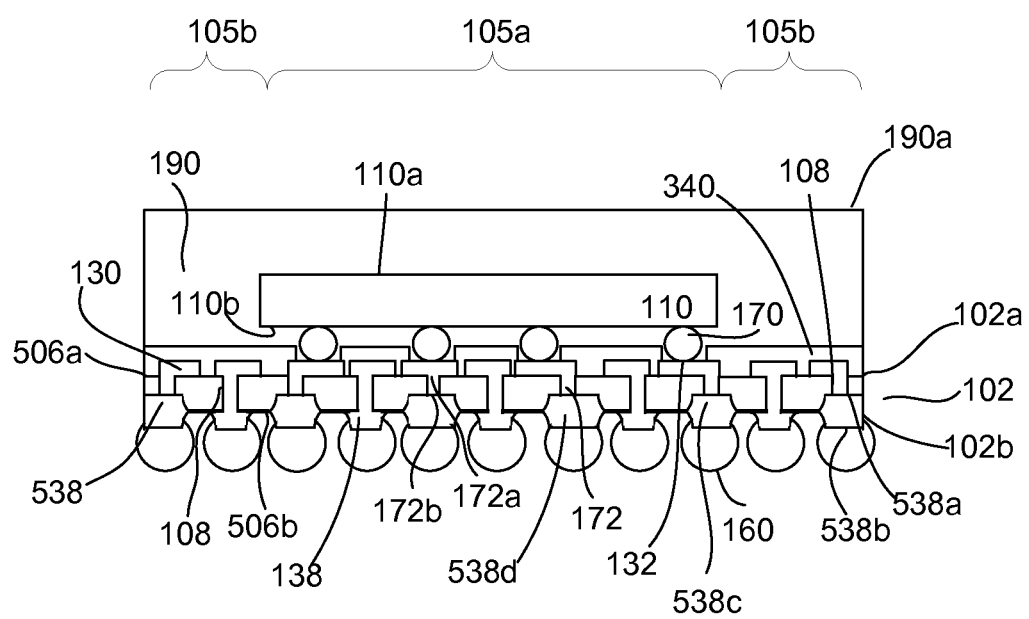

The process continues by forming package contacts 160 coupled to the partially protruded package pads 538, as shown in FIG. 14k. For example, the package contacts are formed and coupled to the package pads, the same as that described in FIG. 12h.

As described in FIG. 14b earlier, in one embodiment, the first major surface 1438a is processed such that it includes a non-planar surface having protruded portions 1438c which define locations under which package pads are formed and a plurality of recesses 1440 which define locations under which no package pads are to be formed. In another embodiment, FIG. 14b may be modified such that package pads may be formed under both the protruded portions 1438c and the recesses 1440 as shown in FIG. 14l. Referring to FIG. 14l, the package includes two types of package pads. The package as shown in FIG. 14l may be formed by similar process steps as described in FIGS. 14a-14k above. As such, only modifications to some of the steps will be described below.

In this alternate embodiment, modifications may be made to the substrate layer as shown in FIG. 14d. For example, cavities 108 are formed over both the protruded portions and the recesses using techniques as described earlier. The process then continues from FIG. 14e to FIG. 14i as described above. For example, the process continues to form conductive studs in the cavities 108 which are formed over the protruded portions and recesses, conductive traces, connection pads, optional protective layer, die attachment and encapsulation. In this alternate embodiment, the process step as described with respect to FIG. 14j may be modified such that the second surface 1438b of the conductive carrier is patterned to form bottom portions 538d of the package pads below the protruded portions as well as package pads 138 below the recesses. The process continues to couple package contacts to the package pads as described in FIG. 14k until a package shown in FIG. 14l is formed.

The processes, as described with respect to FIGS. 12a-12h, FIGS. 13a-13c and FIGS. 14a-14l, result in advantages. For example, the processes as described enable package pads to be formed and coupled directly to the conductive studs. No via contacts which are present in conventional package substrate are formed in these processes, simplifying the manufacturing process. The conductive studs, in one embodiment, are be formed by plating. The use of plating technique provides flexibility in terms of controlling the height of the conductive studs with respect to the surface of the package substrate. Moreover, the width of the conductive studs, as described, is smaller relative to the width of the package pads and the arrangement of the conductive stud, for example, which may be offset from the center of the package pad provide allowance for more traces to pass through the space between any of the two adjacent conductive studs, leading to more flexible and efficient routability of traces, as illustrated in FIG. 18. Additionally, electrical resistance is lowered particularly where the interconnect structure of the package substrate, including the conductive traces, studs and package pads, is formed of a single low electrical resistance material, such as copper. This further enhances the performance of the semiconductor packages.

Furthermore, the processes enable package pads to be formed or protruded outside of the bottom surface of the package substrate. This allows for stand-off type of package pads to be formed. Stand-off type of package pads enable solder climb during reflow, resulting in strong connection structure between the package and the PCB. The slight stand-off also creates a self-centering effect during reflow process.

The optional protective layer over the package substrate includes openings of which die contacts of the die are disposed. As such, the protective layer may serve as a solder dam for the solder bumps, reducing uncontrolled flow of, for example, solder material during the reflow process which may lead to shorting. Furthermore, the process steps as described in the embodiment of FIGS. 14a-14l allow portions of the package pads to be partially engaged or held by lower portions of the substrate layer of the package substrate. As such, the package pads will not be detached easily. This allows for improved robustness and package reliability.

Figure 15A:
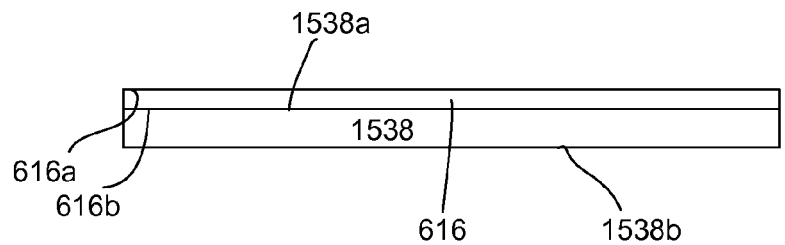

FIGS. 15a-15l show another embodiment of a process for forming a semiconductor package 1500. The process includes similar process to that described in FIGS. 12a-12h. As such, common processes may not be described or described in detail. Referring to FIG. 15a, a first substrate layer 616 is provided over the base or conductive carrier 1538 having first and second surfaces 1538a-1538b, similar to that described in FIG. 12b. The conductive carrier 1538, for example, includes Cu, Cu alloy, stainless steel, silicon, etc. In one embodiment, the first substrate layer 616 includes a first dielectric material. The first dielectric material, for example, includes photoimageable material, such as but not limited to solder mask, or insulating layer, such as but not limited to polyimide, epoxy mold compound or inorganic insulating material. The thickness of the first substrate layer 616 defines the thickness of a part of the interconnect structure, such as package pads 638, which will be described later. The first substrate layer 616, for example, may be formed by spin coating, lamination, vacuum deposition, etc. Other suitable types of dielectric materials and deposition techniques may also be useful for forming the first substrate layer.

Figure 15B:
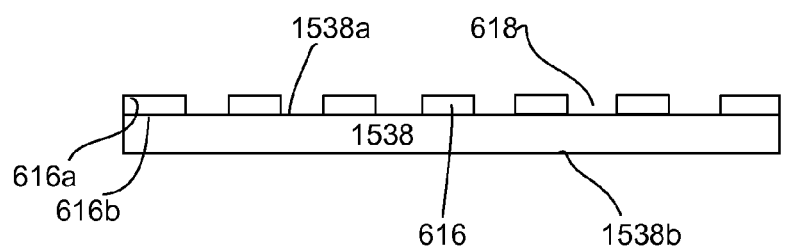

Referring to FIG. 15b, the process continues to remove portions of the first substrate layer 616. In one embodiment, the first substrate layer is patterned to create second type cavities 618 which define the locations where package pads of the package substrate are to be formed. As shown, the cavities 618 extend from the first 616a to the second major surface 616b of the first substrate layer. The dimension of the cavities, for example, defines the dimension of the package pads to be formed later. The width of the cavities, for example, may include any suitable dimensions, depending on the type and dimension of the package contact which will be coupled to the package pads.

Patterning of the first substrate layer 616 may be performed with the use of a patterned masked layer (not shown). Patterning of the first substrate layer can be achieved by any suitable mask and etch techniques. For example, a patterned etch mask (not shown), such as photoresist, is provided over the first substrate layer. An etch may be performed using the etch mask to remove portions of the first substrate layer unprotected by the etch mask, exposing portions of the top surface 1538a of the conductive carrier. The etch, for example, may be an isotropic etch, such as a wet etch. An anisotropic etch, such as reactive ion etch (RIE) may be used. Alternatively, if the first substrate layer includes a photoimageable material, exposure with the assistance of mask and development by organic solvent can also form the pattern in the first substrate layer. Other techniques for patterning the first substrate layer may also be useful.

Figure 15C:
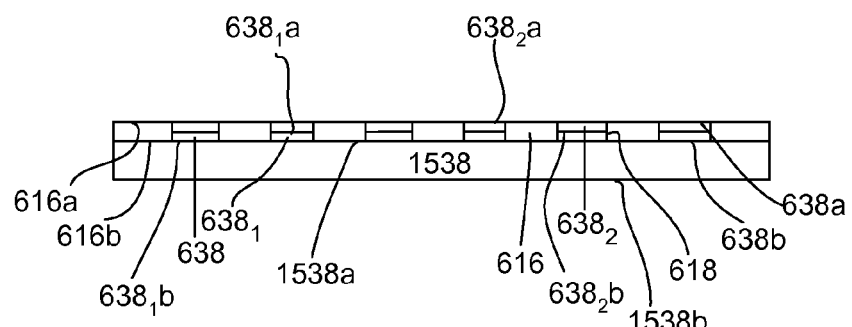

The process continues to form package pads 638 of the package substrate 102. The package pads, for example, may be a single layered or a multi-layered stack. Referring to FIG. 15c, the package pads, in one embodiment, include a multi-layered stack. In one embodiment, the package pads include first and second conductive layers $638_1$ and $638_2$. Providing other number of conductive layers to form the multi-layered stack may also be useful.

In one embodiment, the first conductive layer $638_1$ includes a gold (Au) layer. Other suitable types of materials may also be employed as the first conductive layer, as long as it provides better adhesion to package contacts to form a reliable joint, such as solder joint. The first conductive layer $638_1$ includes first and second major surfaces $638_1a$ and $638_1b$. The second major surface $638_1b$ of the first conductive layer, as shown, is formed over the exposed portions of the top surface 1538a of the conductive carrier. The second conductive layer $638_2$ having first and second major surfaces $638_2a$ and $638_2b$ is formed over the first major surface $638_1a$ of the first conductive layer. The second conductive layer $638_2$, in one embodiment, includes a material different than the first conductive layer $638_1$. In one embodiment, the second conductive layer includes a nickel layer. Other suitable types of materials may also be used as the second conductive layer, so long as it can prevent metal migration between the adjacent metal materials, such as preventing migration between Au and Cu.

In one embodiment, the first and second conductive layers are formed by plating. For example, electrochemical or electroless plating may be employed to form the first and second conductive layers. The exposed portions of the top surface 1538a of the conductive carrier thus serve as a base or substrate for the electroplating process for forming the first conductive layer $638_1$ while the top surface of the first conductive layer $638_1a$ serves as a base or substrate for the electroplating process for forming the second conductive layer $638_2$. The conductive carrier, in one embodiment, serves as a support carrier for forming the package pads. Other suitable types of techniques may also be employed for forming the first and second conductive layers. The first and second conductive layers may include any suitable thickness dimensions. Referring to FIG. 15c, the first surface $638_2a$ of the second conductive layer is about coplanar with a first major surface $616a$ of the first substrate layer. It is understood that the first surface of the second conductive layer may be protruded or recessed below with reference to the first major surface of the first substrate layer.

Figure 15D:
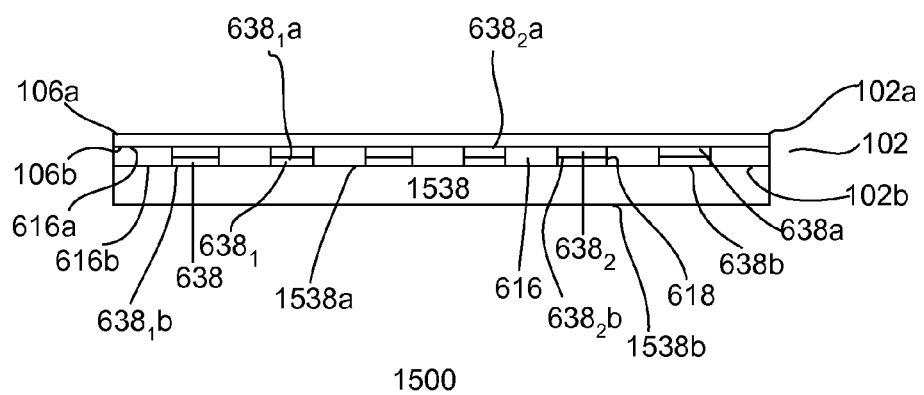

The process continues to form a second substrate layer 106 over the first substrate layer 616. In one embodiment, the second substrate layer having first and second major surfaces 106a-106b is formed over the first surface 616a of the first substrate layer and covers the package pads 638 as shown in FIG. 15d. In one embodiment, the second substrate layer 106 as shown in FIG. 15d is the same as the substrate layer 106 as described in FIG. 12b. Thus, the materials, thickness and process for forming the second substrate layer are the same as the substrate layer as that described in FIG. 12b. For example, the first and second substrate layers may include polyimide. As such, common elements may not be described or described in detail. In another embodiment, the second substrate layer 106 includes different material than the first substrate layer 616. For example, the second substrate layer includes prepreg while the first substrate layer is a solder mask. Other suitable types of materials may also be useful. The thickness of the second substrate layer may define the thickness of a part of the interconnect structure, such as conductive studs, which are to be formed later.

Figure 15E:
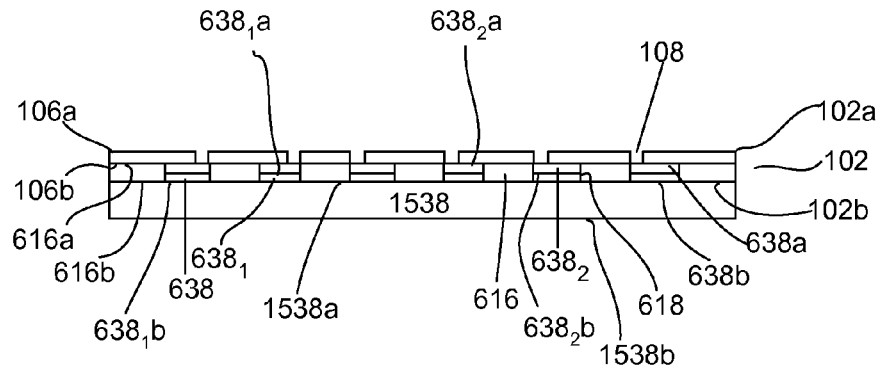

The process continues to remove portions of the second substrate layer 106 as shown in FIG. 15e. In one embodiment, the second substrate layer is patterned to create first type cavities 108 which define the locations where conductive studs of the package substrate are to be formed. The dimension of the cavities 108 and techniques for forming the first type cavities, for example, are the same as the dimension of the cavities 108 as that described in FIG. 12c. Referring to FIG. 15e, the etch may be performed using the etch mask to remove portions of the second substrate layer 106 unprotected by the etch mask (not shown), exposing portions of the top surface $638_2a$ of the second conductive layer. The cavities 108, for example, may be formed at any location within the package pads.

Figure 15F:
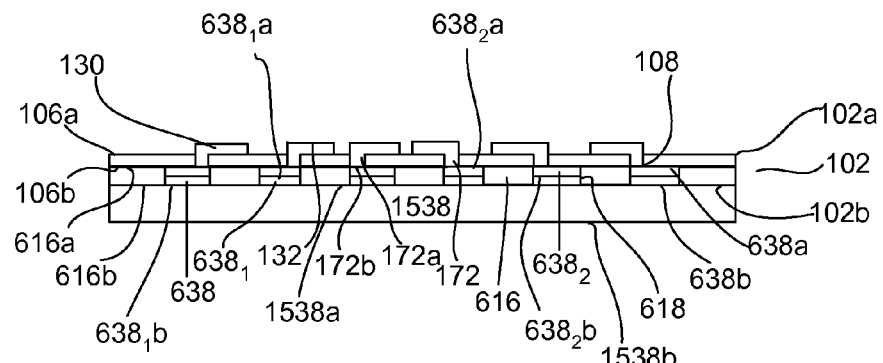

The process continues to form interconnect structures of the package substrate. Referring to FIG. 15f, the process continues to form conductive studs 172 in the first type cavities 108 and over the exposed portions of the top surface $638_2a$ of the second conductive layer. In one embodiment, the conductive studs are formed by plating. The exposed portions of the top surface of the second conductive layer thus also serve as a base or substrate for the electroplating process. Other suitable methods for forming the conductive studs may also be used.

The process continues to form conductive traces 130 and connection pads 132 of the package substrate as shown in FIG. 15f. The features of the conductive studs, conductive traces and connection pads and the forming techniques, for example, are the same as that described in FIG. 12d.

Figure 15G:
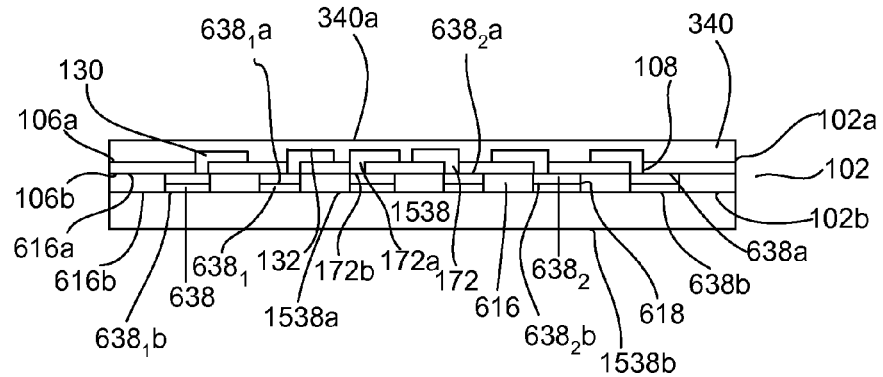
Figure 15H:
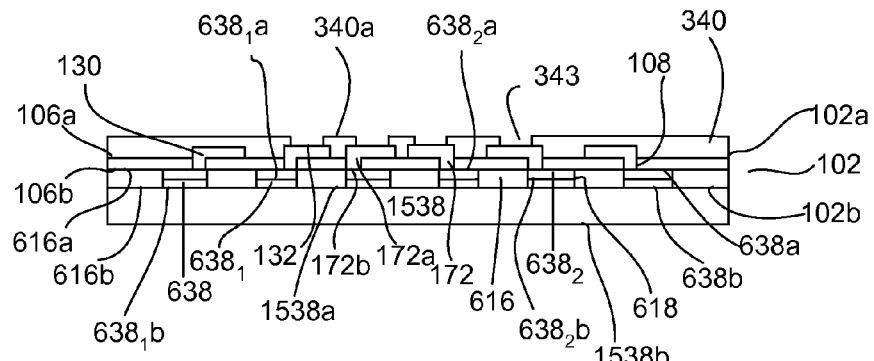

A protective layer 340 may optionally be provided over the package substrate 102 as shown in FIG. 15g. As shown, the protective layer is formed over and covers the first major surface 106a of the second substrate layer 106 including the conductive traces and connection pads. The process continues to remove portions of the protective layer as shown in FIG. 15h. In one embodiment, the protective layer is patterned to create openings 343 which define the locations where die contacts of a die are to be disposed. The features and technique for forming the protective layer 340 and the openings 343, for example, are the same as the optional protective layer as that described in FIGS. 13a-13b.

Figure 15I:
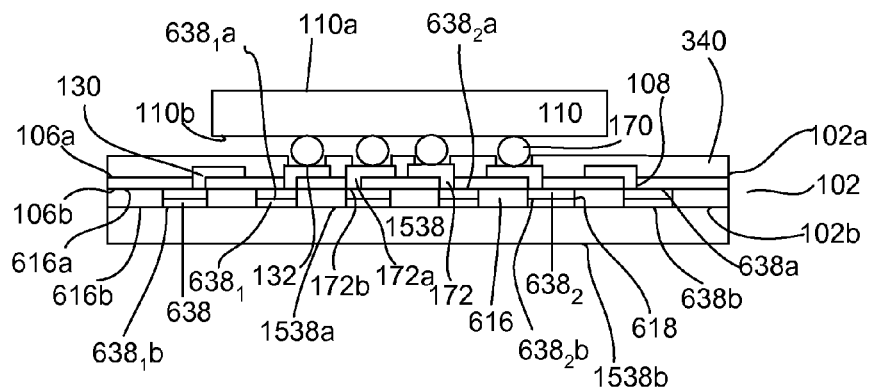
Figure 15J:
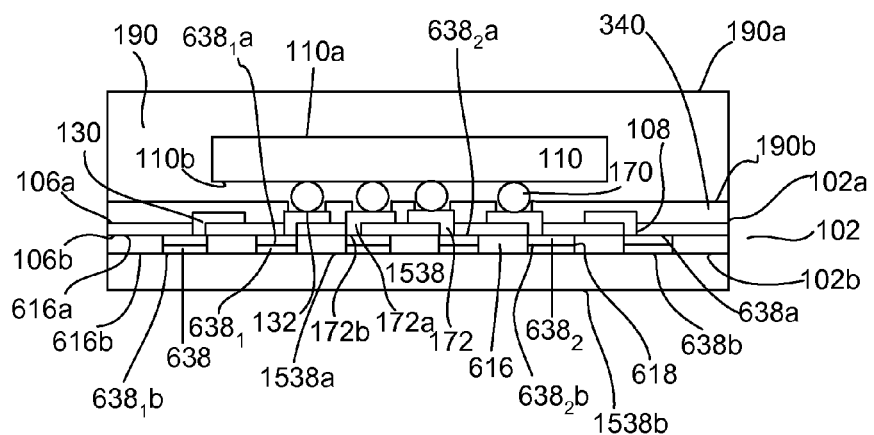

Referring to FIG. 15i, a flip chip 110 having die contacts 170 on an active surface 110b of the die is mounted onto the die region of the package substrate. As shown, the die contacts are disposed within the openings 343 of the optional protective layer and are coupled to the exposed connection pads. Referring to FIG. 15j, the process continues to form a cap 190 to cover over the package substrate, the same as that described in FIG. 12f.

Figure 15K:
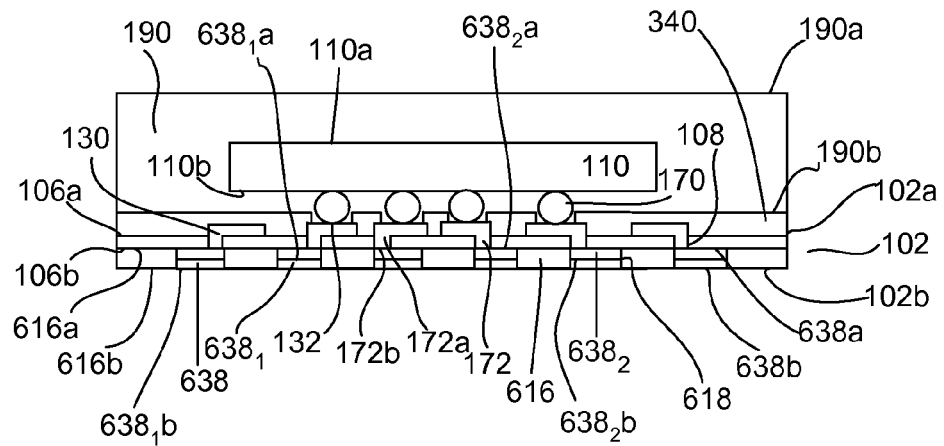

The process continues to remove the conductive carrier 1538, as shown in FIG. 15k. In one embodiment, the conductive carrier 1538 is completely removed from the package substrate. As such, the conductive carrier, in one embodiment, does not form part of the interconnect structure, such as part of the package pad, of the package substrate. In one embodiment, the conductive carrier is removed by an etch process. The etch process, for example, removes the base carrier, exposing the second surfaces of the first substrate layer and the first conductive layer of the package pads 616b and $638_1b$. Since the first substrate layer as well as the first conductive layer $638_1$ include different material than that of the base carrier, the first substrate layer and the first conductive layer serve as an etch stop or barrier layer during the removal of the conductive carrier. The etch process, such as chemistry and other parameters, may be tailored to selectively remove the desired material with respect to the other material. Other suitable types of techniques, such as grinding or peel off technique, may also be employed to remove the conductive carrier. In one embodiment, the encapsulated structure serves to provide mechanical support during removal of the conductive carrier.

Figure 15L:
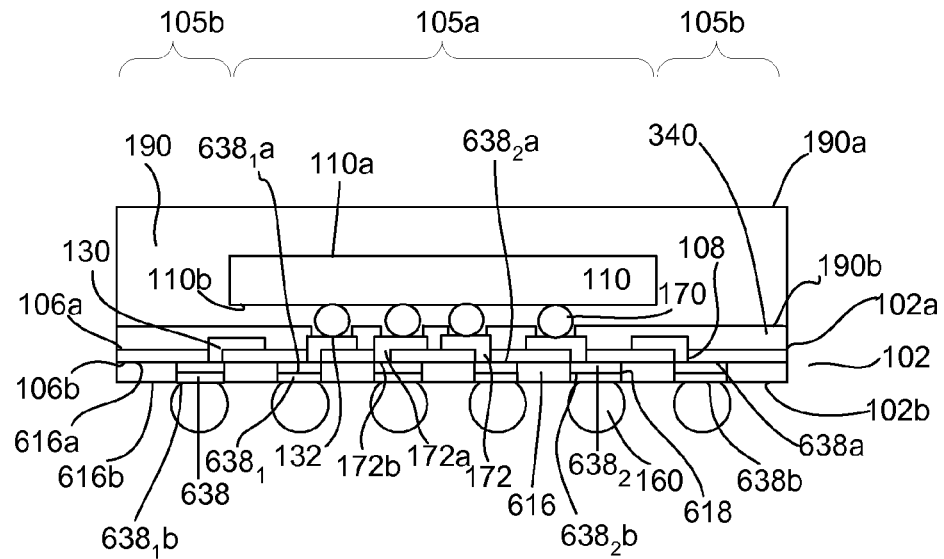

The process continues by forming package contacts 160 coupled to the exposed bottom surfaces 638b of the package pads, as shown in FIG. 15l. For example, the package contacts are formed and coupled to the exposed surfaces $638_1b$ of the first conductive layer. The material and technique for forming the package contacts are similar to that described in FIG. 12h.

Figure 16A:
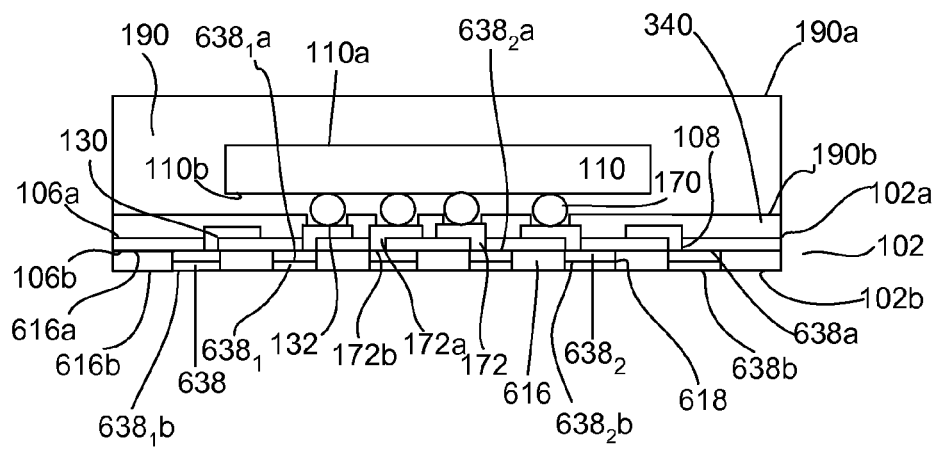

FIGS. 16a-16d show another embodiment of a process for forming a semiconductor package 1600. The process includes similar process to that described in FIGS. 15a-15l. As such, common processes may not be described or described in detail. Referring to FIG. 16a, a partially processed package substrate is provided. The partially processed package substrate is the same as that described in FIG. 15k. For example, the conductive carrier 1538 is removed, exposing the bottom surfaces of the first substrate layer and the package pads 616b and $638_1b$. As such, common elements may not be described or described in detail.

Figure 16B:
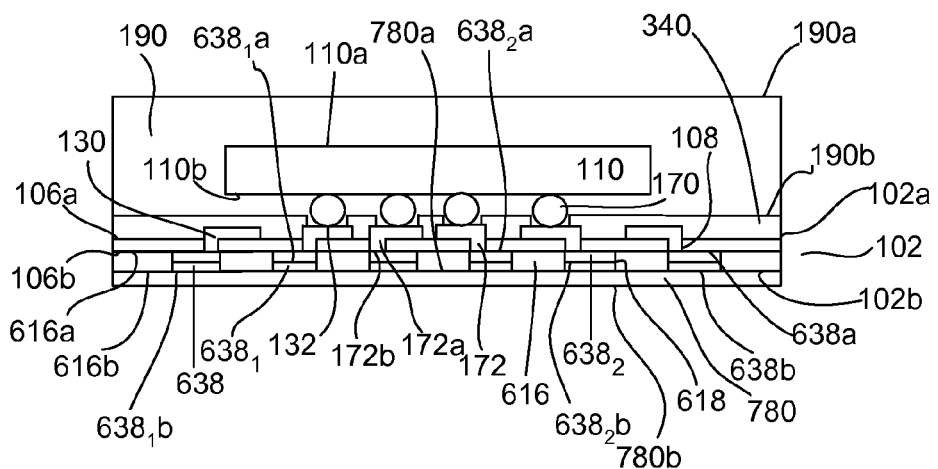

In one embodiment, an insulating layer 780 may optionally be formed over the exposed bottom major surface of the package substrate 102b. Referring to FIG. 16b, the optional insulating layer is formed over and covers the bottom major surfaces of the first substrate layer and the exposed bottom surfaces of the package pads, such as the bottom surfaces $638_1b$ of the first conductive layer. In one embodiment, the insulating layer 780 includes solder mask, mold compound or stress relief layer as described in FIG. 4. Other suitable types of dielectric material and suitable thickness dimension may be used for the insulating layer 780. The insulating layer, for example, may be formed by molding or lamination technique. Other types of dielectric materials and deposition techniques may also be useful for forming the insulating layer.

Figure 16C:
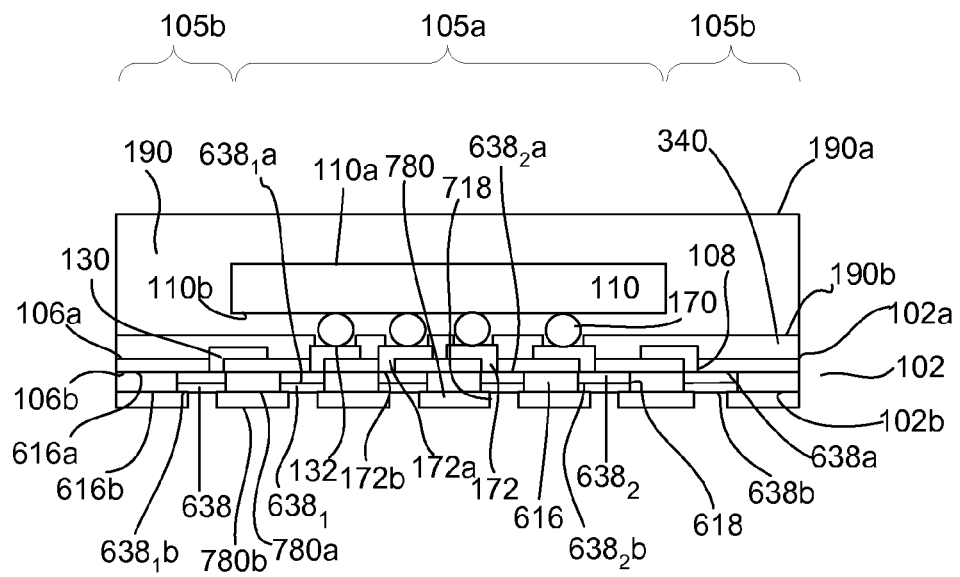

The process continues to remove portions of the insulating layer 780 as shown in FIG. 16c. In one embodiment, the insulating layer is patterned to create third type cavities or openings 718 which expose portions of the bottom surfaces 638b of the package pads. As shown, the openings 718 extend from the first 780a to the second major surface 780b of the insulating layer. The dimension of the openings 718, for example, includes any suitable dimension and may be smaller than the width of the package pads 638. Other suitable width dimensions may also be useful, depending on the type and dimension of the package contacts formed later.

Patterning of the insulating layer may be performed with the use of a patterned masked layer (not shown). Patterning of the insulating layer can be achieved by any suitable mask and etch techniques. For example, a patterned etch mask (not shown), such as photoresist, is provided over the insulating layer. An etch may be performed using the etch mask to remove portions of the insulating layer unprotected by the etch mask, exposing at least portions of the bottom surfaces $638_1b$ of the first conductive layer of the package pads. The etch, for example, may be an isotropic etch, such as a wet etch. An anisotropic etch, such as reactive ion etch (RIE) may be used. Other techniques for patterning the insulating layer may also be useful.

Figure 16D:
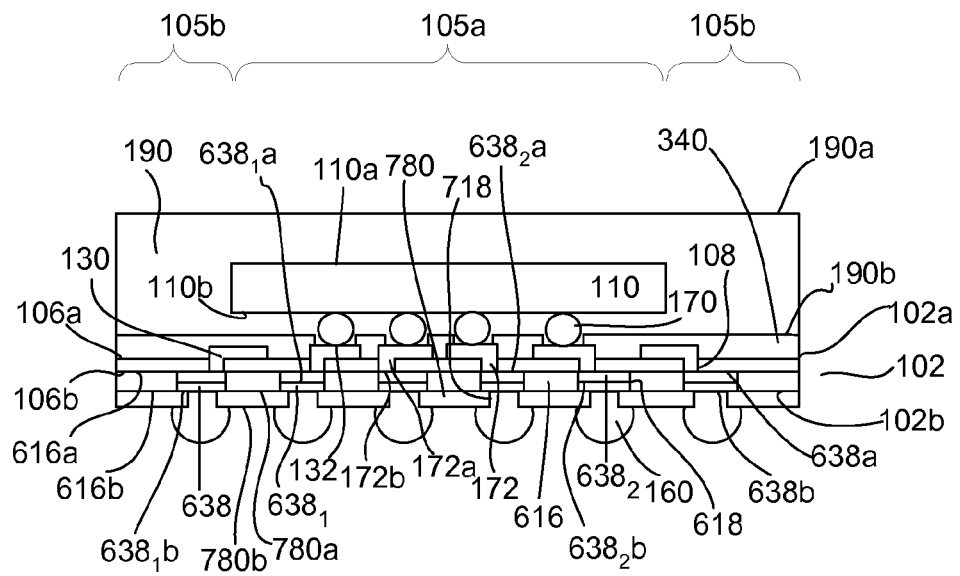

After patterning the insulating layer, the process continues by forming package contacts 160 coupled to the exposed bottom surfaces 638b of the package pads, such as the exposed surfaces of the first conductive layer, as shown in FIG. 16d. In one embodiment, the portions of the top portion of the package contacts are formed within the openings 718 and are coupled to the package pads. Features and techniques for forming the package contacts are similar to that described in FIG. 15l.

Figure 17A:
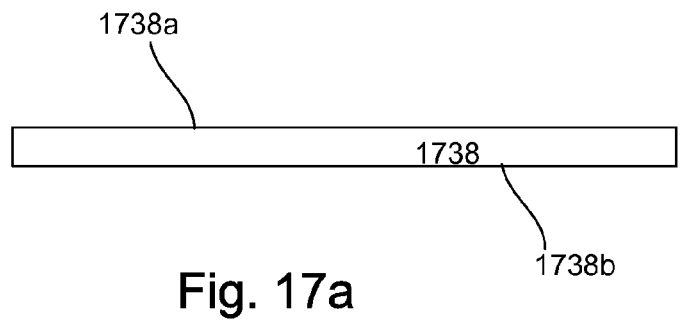
Figure 17B:
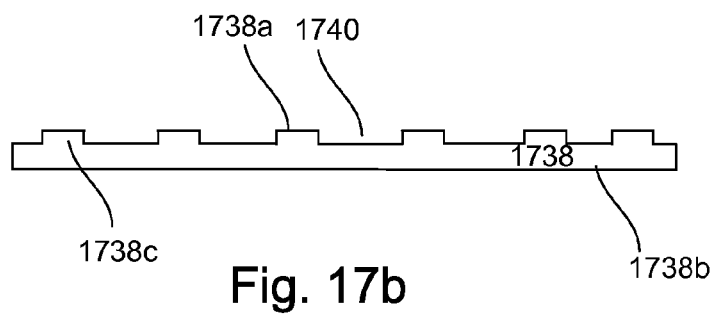
Figure 17C:
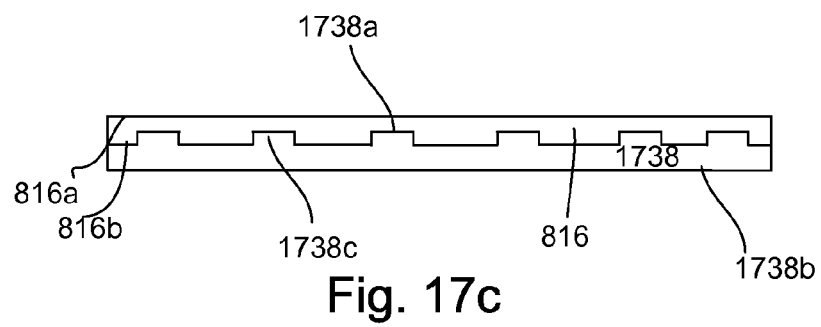
Figure 17D:
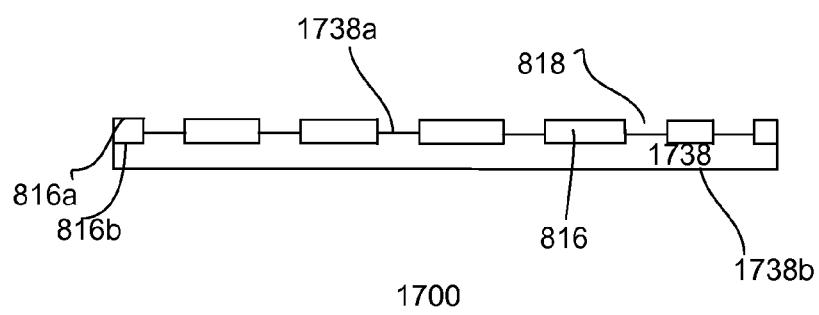
Figure 17E:
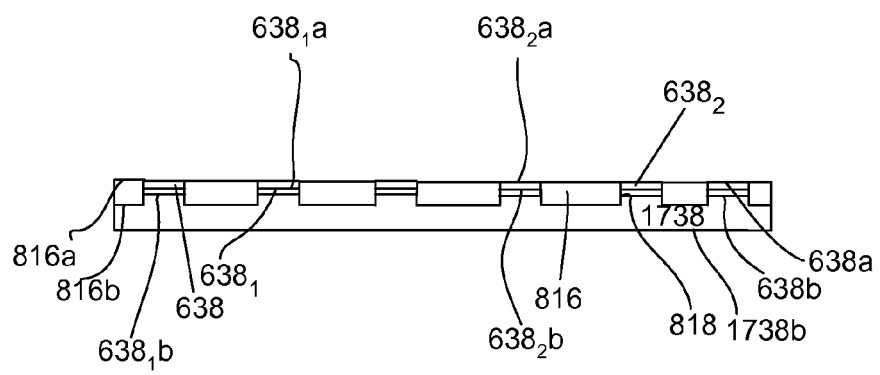
Figure 17F:
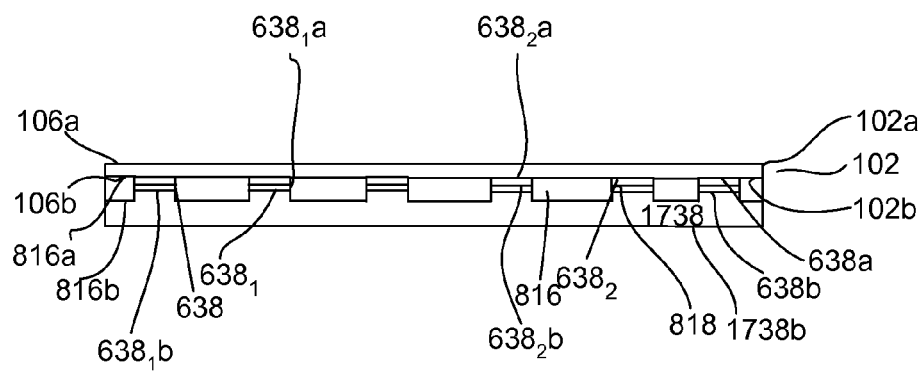
Figure 17G:
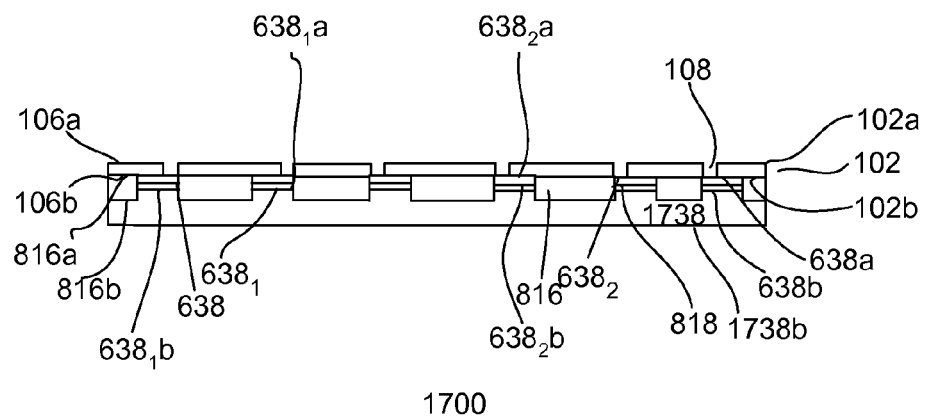
Figure 17H:
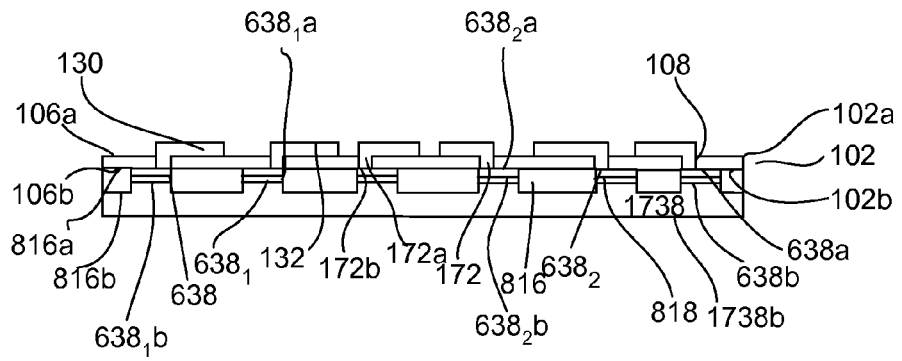
Figure 17I:
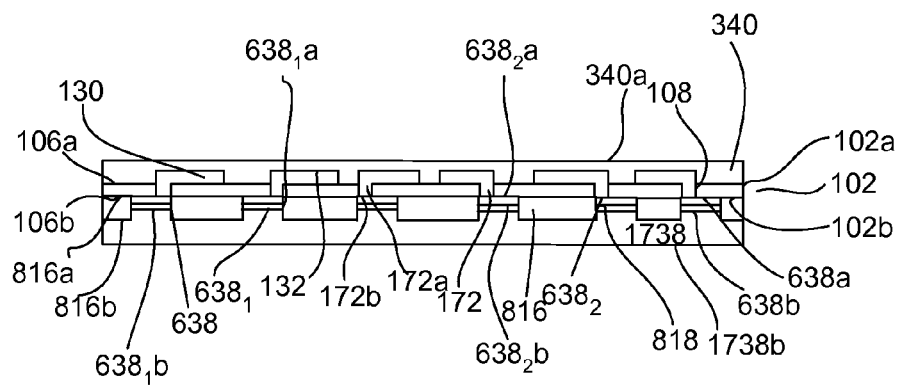
Figure 17J:
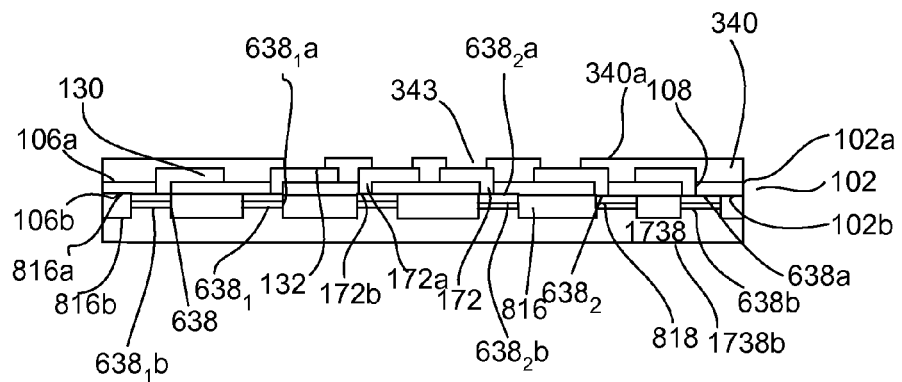
Figure 17K:
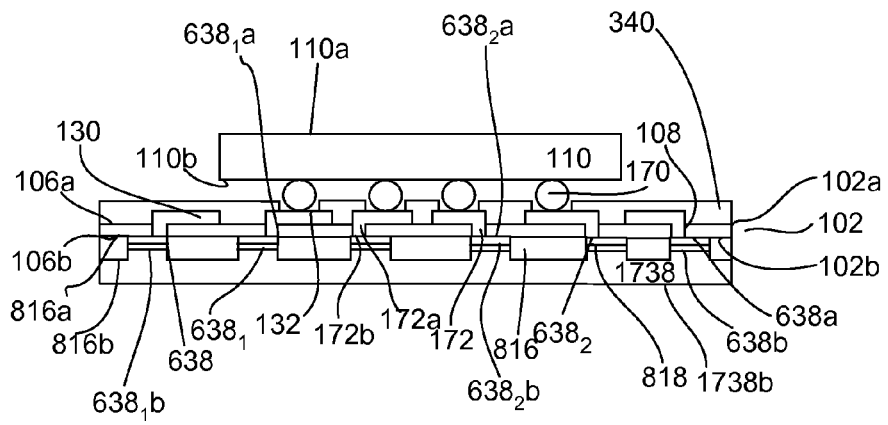
Figure 17L:
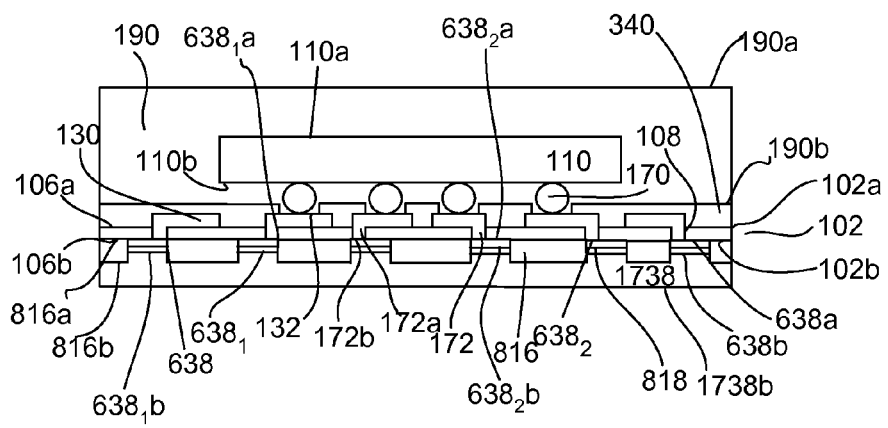
Figure 17M:
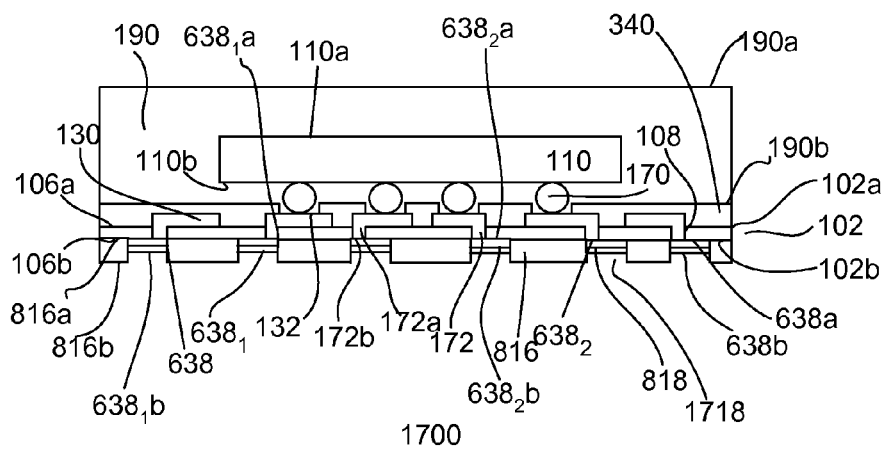
Figure 17N:
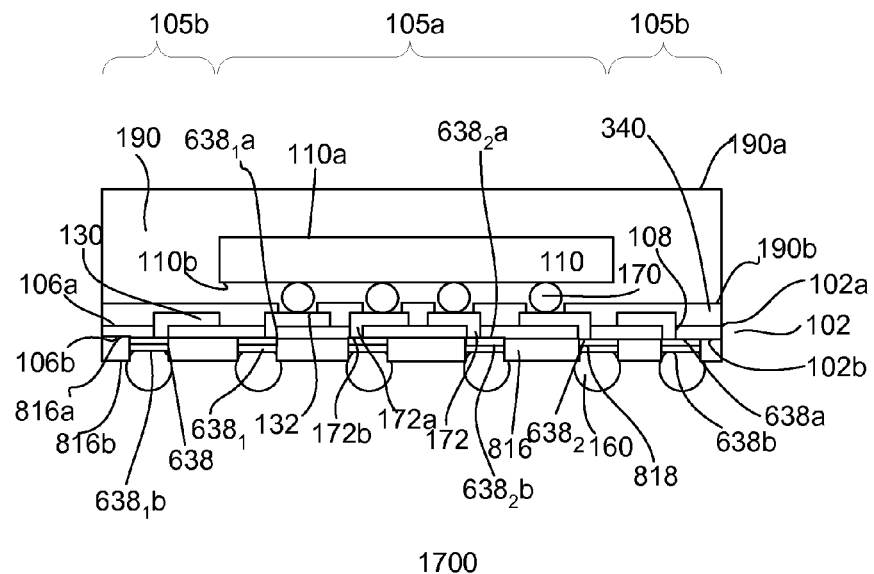

FIGS. 17a-17n show another embodiment of a process for forming a semiconductor package 1700. The process includes similar process to that described in FIGS. 12a-12h and FIGS. 15a-15l. As such, common processes may not be described or described in detail. Referring to FIG. 17a, a base or conductive carrier 1738 having first and second surfaces 1738a-1738b is provided. The conductive carrier 1738 is the same as the conductive carrier as that described in FIG. 15a. The materials and features of the conductive carrier are the same as that described in FIG. 15a. As such, common elements may not be described or described in detail.

Referring to FIG. 17b, the first major surface 1738a of the conductive carrier, in one embodiment, is processed to create a topography which defines package pad regions as well as non-package pads regions. For example, package pad regions of the package substrate, for example, may be referred to areas where package pads are formed while non-package pad regions may be referred to areas where no package pads are formed. In one embodiment, the first major surface 1738a is processed such that it includes a non-planar surface having protruded portions 1738c and a plurality of recesses 1740. The protruded portions 1738c define locations over which package pads are formed while the recesses define locations over which no package pads are to be formed.

Patterning of the first major surface 1738a may be achieved using, for example, mask and etch techniques. The etch, for example, includes a wet etch. Other suitable techniques for patterning the first major surface may also be useful.

The process continues to form a package substrate and interconnect structure of the package substrate. Referring to FIG. 17c, the process continues to form a built-up or integrated wiring substrate. In one embodiment, the package substrate includes a multi-layered substrate. In one embodiment, a first substrate layer 816 is provided over the first surface 1738a of the conductive carrier. As shown, the first substrate layer 816 covers the first major surface 1738a of the conductive carrier, including the recesses 1740. The materials and process for forming the first substrate layer 816, for example, are the same as the first substrate layer 616 as that described in FIG. 15b. The thickness of the first substrate layer 816, for example, includes any suitable thickness dimensions. Other suitable types of dielectric material and techniques for forming the first substrate layer 816 may also be useful.

Referring to FIG. 17d, the process continues to remove portions of the first substrate layer 816. In one embodiment, the first substrate layer 816 is patterned to create second type cavities 818 which define locations where package pads of the package substrate are to be formed. In one embodiment, the cavities 818 are formed over the protruded portions of the first major surface of the conductive carrier under which package pads are to be formed. As shown, the cavities extend partially from the first towards the second major surface of the first substrate layer 816. The width of the cavities 818, for example, is the same as the width of the protruded portions 1738c of the conductive carrier. The dimension of the cavities, for example, may be the same as the cavities 618 as described in FIG. 15b. The technique used for forming the cavities, for example, is similar to that described in FIG. 15b. Other suitable dimensions of the cavities and techniques may also be used to form the cavities 818. In one embodiment, the etch stops on the top surface of the protruded portions of the conductive carrier. As shown, the top surface of the protruded portions of the conductive carrier is exposed.

The process continues to form package pads 638 of the package substrate. The package pads, for example, may include a single layered or a multi-layered stack. Referring to FIG. 17e, the package pads, in one embodiment, include a multi-layered stack. In one embodiment, the package pads include first and second conductive layers $638_1$ and $638_2$. Providing other number of layers to form the multi-layered stack may also be useful.

In one embodiment, the first and second conductive layers $638_1$ and $638_2$ include the same materials and are formed by the same technique as that described in FIG. 15c. In one embodiment, the second major surface of the first conductive layer $638_1b$, as shown, is disposed over the exposed protruded portions of the conductive carrier and the second conductive layer $638_2$ having first and second major surfaces $638_2a$ and $638_2b$ is provided over the first major surface $638_1a$ of the first conductive layer.

In one embodiment, the first and second conductive layers are formed by plating. In one embodiment, the exposed protruded portions of the top surface of the conductive carrier thus serve as a base or substrate for the electroplating process for forming the first conductive layer while the top surface of the first conductive layer serves as a base or substrate for the electroplating process for forming the second conductive layer. The patterned conductive carrier, in one embodiment, also serves as a support carrier for forming the package pads. Other suitable types of techniques may also be employed for forming the first and second conductive layers. Referring to FIG. 17e, the first surface $638_2a$ of the second conductive layer is about coplanar with a first major surface 816a of the first substrate layer. It is understood that the first surface of the second conductive layer may be protruded or recessed below with reference to the first major surface of the first substrate layer.

Referring to FIG. 17f, the process continues to form a second substrate layer 106 over the first substrate layer 816. In one embodiment, the second substrate layer having first and second major surfaces 106a-106b is provided over the first surface 816a of the first substrate layer and covers the package pads 638 as shown in FIG. 17f. In one embodiment, the second substrate layer 106 is formed by the same technique and includes the same dielectric material and thickness of the second substrate layer as that described in FIG. 15d. In one embodiment, the thickness of the second substrate layer may define the thickness of a part of the interconnect structure, such as conductive studs, which are to be formed later.

As shown in FIG. 17g, the process continues to remove portions of the second substrate layer 106. In one embodiment, the second substrate layer 106 is patterned to create first type cavities 108 which define the locations where conductive studs 172 of the package substrate are to be formed. The dimension of the cavities and techniques for forming the first type cavities, for example, are the same as the dimension of the cavities as that described in FIG. 12c and FIG. 15e. The process continues to form interconnect structures of the package substrate. Referring to FIG. 17h, the process continues to form conductive studs 172 in the first type cavities 108 and over the exposed portions of the top surface $638_2a$ of the second conductive layer by a plating process. As shown in FIG. 17h, conductive traces 130 and connection pads 132 of the package substrate are formed. The features and techniques for forming the conductive studs, conductive traces and connection pads, for example, are the same as that described in FIG. 12d.

A protective layer 340 may optionally be formed over the package substrate 102 as shown in FIG. 17i. As shown, the protective layer is formed over and covers the first major surface 106a of the second substrate layer including the conductive traces and connection pads. The process continues to remove portions of the protective layer as shown in FIG. 17j, forming openings 343 which define the locations where die contacts of a die are to be disposed, the same as that described in FIG. 13b and FIG. 15h. As such, common elements may not be described.

Referring to FIG. 17k, a flip chip 110 having die contacts 170 on an active surface 110b of the die is mounted onto the die region of the package substrate, the same as that described with respect to FIG. 15i. As shown in FIG. 17l, the process continues to form a cap 190 to cover over the package substrate, similar to that described in FIG. 12f and FIG. 15j.

The process continues to remove the patterned conductive carrier, as shown in FIG. 17m. In one embodiment, the patterned conductive carrier is completely removed from the package substrate. As such, the conductive carrier, in one embodiment does not form part of the interconnect structure, such as part of the package pad, of the package substrate. In one embodiment, the conductive carrier is removed by an etch process. The etch process, for example, removes the base carrier, exposing the bottom surfaces of the first substrate layer and the first conductive layer of the package pads 816b and $638_1b$. Since the first conductive layer $638_1$ and the first substrate layer 816 include different materials than the base carrier 1738, the first conductive layer and the first substrate layer serve as an etch stop or barrier layer during the removal of the conductive carrier. The etch process, such as chemistry and other parameters, may be tailored to selectively remove the desired material with respect to the other material. Other suitable types of techniques may also be employed to remove the conductive carrier. As shown in FIG. 17m, the bottom surfaces of the first conductive and substrate layers $638_1b$ and 816b are non-coplanar with each other. In one embodiment, the bottom surface 816b of the first substrate layer is lower than the bottom surface 638b of package pad. As such, the removal of the conductive carrier forms cavities 1718 having the same width as the package pads within the first substrate layer 816 which extend from the second major surface 816b of the first substrate layer. As shown, a step is formed between the first substrate layer 816 and the package pads 638. The sides of the package pads, as shown, are completely surrounded and engaged by the first substrate layer. In one embodiment, the encapsulated structure serves to provide mechanical support during removal of the conductive carrier.

The process continues by forming package contacts 160 on the exposed bottom surfaces 638b of the package pads, as shown in FIG. 17n. In one embodiment, the package contacts are formed and coupled to the exposed bottom surfaces $638_1b$ of the first conductive layer. The material and technique for forming the package pads are similar to that described in FIG. 12h. In one embodiment, the package contacts 160 are partially disposed within the cavities 1718 of the first substrate layer. For example, the top portions of the package pads are disposed in the cavities.

The embodiments described with respect to FIGS. 15a-15l, FIGS. 16a-16d and FIGS. 17a-17n include some or all advantages as described with respect to FIGS. 12a-12h and FIGS. 13a-13c and FIGS. 14a-14l. As such, these advantages will not be described or described in detail. The embodiments, as described with respect to FIGS. 15a-15l, FIGS. 16a-16d and FIGS. 17a-17n result in additional advantages. The package pads, as described are formed from using plating techniques and allows for forming package pads with multiple conductive layers. Thus, this provides flexibility for designers to choose different combination of conductive materials to form the package pad with desired properties. Furthermore, these processes also enable sides of the package pads, for example, to be at least partially or completely covered by the first substrate layer. The package pads thus are at least partially or completely engaged or held by the first substrate layer. Furthermore, the formation of an insulating layer disposed below the first substrate layer which includes openings which expose only portions of the bottom surfaces of the package pads while the remaining portions of the bottom surfaces of the package pads are covered by the insulating layer as described in FIGS. 16a-16d provides superior locking mechanism for the package pads. Thus, the insulating layer prevents the package pads to be detached, which further improves the package reliability. Similarly, the process as described in the embodiment of FIGS. 17a-17n allows the first substrate layer to partially overlap the package pads. This embodiment also avoids packages pads to be detached.

The processes as described with respect to FIGS. 12a-12h, FIGS. 13a-13c, FIGS. 14a-14l, FIGS. 15a-15l, FIGS. 16a-16d and FIGS. 17a-17n are suitable for flip chip type of die or chip packages. It is understood that these processes may also be useful or modified for other types of dies, including wirebonded chip, TSV chip or stacked or planar chip arrangements to form semiconductor packages 900-1100 as described in FIGS. 9-11.

The invention may be embodied in other specific forms without departing from the spirit or essential characteristics thereof. The foregoing embodiments, therefore, are to be considered in all respects illustrative rather than limiting the invention described herein.

What is claimed is:

1. A method for forming a semiconductor package comprising:
   providing a conductive carrier having first and second major surfaces;
   processing the first major surface of the conductive carrier to form a topography having at least one protruded portion and at least one recess;
   providing a package substrate having first and second major surfaces, wherein providing the package substrate comprises forming at least one substrate layer over the first major surface of the conductive carrier and filling the recess, and forming at least first and second cavities through the at least one substrate layer, wherein the first cavity is formed over the at least one protruded portion while the second cavity is formed over the at least one recess of the conductive carrier;

forming interconnect structures, wherein forming the interconnect structures includes forming conductive studs within the first and second cavities, forming conductive traces and connection pads over the first major surface of the package substrate and coupled to top surfaces of the conductive studs, and forming package pads, wherein the package pads are directly coupled to the conductive studs;

providing a die having conductive contacts on its first or second surface, wherein the conductive contacts of the die are electrically coupled to the interconnect structures; and forming a cap over the package substrate to encapsulate the die.

2. The method of claim 1 wherein:

the at least one substrate layer comprises a single layered substrate.

3. The method of claim 1 wherein the conductive studs, conductive traces and connection pads are formed by a plating process.

4. The method of claim 3 wherein the package pad is formed by:

providing a mask having at least first and second openings over the second surface of the conductive carrier; and removing portions of the conductive carrier exposed by the openings of the mask, wherein the remaining portions of the conductive carrier which are directly below the conductive studs define the package pads, and at least a portion of the package pad is protruded outside of the second surface of the package substrate.

5. The method of claim 4 comprising forming package contacts, wherein the package contacts are coupled to the protruded portions of the package pads.

6. The method of claim 4 comprising forming a protective layer over the first major surface of the package substrate, wherein the protective layer comprises a plurality of openings which define the locations where die contacts of the die are disposed.

7. The method of claim 4 wherein the package pad which is directly coupled to the conductive stud disposed within the first cavity formed over the protruded portion of the conductive carrier corresponds to a first type package pad, while the package pad which is directly coupled to the conductive stud disposed within the second cavity formed over the recess of the conductive carrier corresponds to a second type package pad.

8. The method of claim 7 wherein the first type package pad comprises a top portion and a bottom portion, wherein the bottom portion of the first type package pad is protruded outside of the second surface of the package substrate, while the top portion of the first type package pad is engaged by lower portion of the substrate layer.

9. The method of claim 8 wherein the entire of the second type package pad is disposed over and outside of the second major surface of the package substrate.

10. The method of claim 1 wherein the package pad which is directly coupled to the conductive stud disposed within the first cavity formed over the protruded portion of the conductive carrier corresponds to a first type package pad, while the package pad which is directly coupled to the conductive stud disposed within the second cavity formed over the recess of the conductive carrier corresponds to a second type package pad.

11. The method of claim 10 wherein the first type package pad comprises a top portion and a bottom portion, wherein the bottom portion of the first type package pad is protruded outside of the second surface of the package substrate, while the top portion of the first type package pad is engaged by lower portion of the substrate layer.

12. The method of claim 11 wherein the entire of the second type package pad is disposed over and outside of the second major surface of the package substrate.

13. A method for forming a semiconductor package comprising:

providing a conductive carrier having first and second major surfaces;

processing the first major surface of the conductive carrier to form a topography having a plurality of protruded portions and a plurality of recesses;

providing a package substrate having first and second major surfaces, wherein providing the package substrate comprises forming a substrate layer over the first major surface of the conductive carrier and filling the recesses, and forming a plurality of cavities through the substrate layer, wherein the cavities are formed over both the protruded portions and recesses;

forming interconnect structures, wherein forming the interconnect structures comprises forming conductive studs within the cavities, forming conductive traces and connection pads over the first major surface of the package substrate and coupled to top surfaces of the conductive studs, and forming package pads, wherein the package pads are directly coupled to the conductive studs;

providing a die having conductive contacts on its first or second surface, wherein the conductive contacts of the die are electrically coupled to the interconnect structures; and forming a cap over the package substrate to encapsulate the die.

14. The method of claim 13 wherein the conductive studs, conductive traces and connection pads are formed by a plating process.

15. The method of claim 14 wherein the package pad is formed by:

providing a mask having openings over the second surface of the conductive carrier; and removing portions of the conductive carrier exposed by the openings of the mask, wherein the remaining portions of the conductive carrier which are directly below the conductive studs define the package pads.

16. The method of claim 15 comprising forming package contacts, wherein the package contacts are coupled to the package pads.

17. The method of claim 15 wherein the package pad which is directly coupled to the conductive stud disposed within the cavity formed over the protruded portion of the conductive carrier corresponds to a first type package pad, while the package pad which is directly coupled to the conductive stud disposed within the cavity formed over the recess of the conductive carrier corresponds to a second type package pad.

18. The method of claim 17 wherein the first type package pad comprises a top portion and a bottom portion, wherein the bottom portion of the first type package pad is protruded outside of the second surface of the package substrate while the top portion of the first type package pad is engaged by the protruded portion of the substrate layer.

19. The method of claim 18 wherein the entire of the second type package pad is disposed over and outside of the second major surface of the package substrate.

20. The method of claim 15 comprising forming a protective layer over the first major surface of the package substrate, wherein the protective layer comprises a plurality of openings which define the locations where die contacts of the die are disposed.

21. A semiconductor package comprising:
a package substrate having first and second major surfaces, wherein the package substrate comprises a substrate layer, wherein
the second major surface of the package substrate comprises a non-planar surface with a topography having a plurality of protruded portions and a plurality of recesses,
first and second type cavities passing through the substrate layer, wherein the first type cavities extend from the first major surface of the package substrate to the recesses, while the second type cavities extend from the first major surface of the package substrate to the protruded portions;
interconnect structures, wherein the interconnect structures include
conductive studs disposed within the first and second type cavities,
conductive traces and connection pads disposed over the first major surface of the package substrate and coupled to top surfaces of the conductive studs, and
first and second type package pads, wherein the first type package pads are directly coupled to the conductive studs disposed within the first type cavities and the second type package pads are directly coupled to the conductive studs disposed within the second type cavities;
a die having conductive contacts on its first or second surface, wherein the conductive contacts of the die are electrically coupled to the interconnect structures; and
a cap over the package substrate to encapsulate the die.

22. The semiconductor package of claim 21 wherein the first type package pad comprises a top portion and a bottom portion, wherein the bottom portion of the first type package pad is protruded outside of the second surface of the package substrate, while the top portion of the first type package pad is engaged by protruded portion of the substrate layer.

23. The semiconductor package of claim 22 wherein the entire second type package pad is disposed over and outside of the protruded portion of the substrate layer.

24. The semiconductor package of claim 21 further comprising package contacts, wherein the package contacts are coupled to the package pads.

25. The semiconductor package of claim 21 comprising a protective layer disposed over the first major surface of the package substrate, wherein the protective layer comprises a plurality of openings which define the locations where die contacts of the die are disposed.

* * * * *